(12) United States Patent
Park

(10) Patent No.: US 9,711,587 B2
(45) Date of Patent: Jul. 18, 2017

(54) ORGANIC LIGHT EMITTING DISPLAY DEVICE

(71) Applicant: LG Display Co., Ltd., Seoul (KR)

(72) Inventor: Jaehee Park, Gumi-si (KR)

(73) Assignee: LG DISPLAY CO., LTD., Seoul (KR)

(*) Notice: Subject to any disclaimer, the term of this patent is extended or adjusted under 35 U.S.C. 154(b) by 8 days.

(21) Appl. No.: 14/850,696

(22) Filed: Sep. 10, 2015

(65) Prior Publication Data

US 2016/0190228 A1    Jun. 30, 2016

(30) Foreign Application Priority Data

Dec. 31, 2014 (KR) .......... 10-2014-0196003
Apr. 30, 2015 (KR) .......... 10-2015-0061775

(51) Int. Cl.
*H01L 27/32* (2006.01)

(52) U.S. Cl.
CPC ...... *H01L 27/3279* (2013.01); *H01L 27/3218* (2013.01); *H01L 27/3276* (2013.01); *H01L 27/3297* (2013.01)

(58) Field of Classification Search
CPC .......... H01L 27/3276; H01L 27/3279
See application file for complete search history.

(56) References Cited

U.S. PATENT DOCUMENTS

| 2004/0017149 | A1 | 1/2004 | Matsumoto et al. |
| 2006/0238463 | A1 | 10/2006 | Kim et al. |
| 2008/0074361 | A1* | 3/2008 | Lee .......... G09G 3/32 345/77 |
| 2013/0341607 | A1* | 12/2013 | Heo .......... H01L 51/56 257/40 |
| 2014/0353616 | A1 | 12/2014 | Park et al. |

FOREIGN PATENT DOCUMENTS

EP    1717789 A2    11/2006

* cited by examiner

*Primary Examiner* — Lex Malsawma
*Assistant Examiner* — Xia Cross
(74) *Attorney, Agent, or Firm* — Birch, Stewart, Kolasch & Birch, LLP

(57) ABSTRACT

Provided is an organic light emitting display device. The organic light emitting display device includes: a plurality of sub-pixels including an anode and a cathode; an anode line configured to supply an anode voltage to the anode; and a cathode line configured to supply a cathode voltage to the cathode, and in each of the plurality of sub-pixels, a direction of an anode voltage input of the anode line and a direction of a cathode voltage input of the cathode line are different from each other and face each other in order to reduce a deviation in a potential difference between the anode and the cathode. Thus, it is possible to improve uniformity in the potential difference between the anode and the cathode caused by a line resistance.

16 Claims, 19 Drawing Sheets

ORGANIC LIGHT EMITTING DISPLAY DEVICE

CROSS-REFERENCE TO RELATED APPLICATIONS

This application claims the priority of Korean Patent Application No. 10-2014-0196003 filed on Dec. 31, 2014, and Korean Patent Application No. 10-2015-0061775 filed on Apr. 30, 2015 in the Korean Intellectual Property Office, which are all incorporated herein by reference.

BACKGROUND OF THE INVENTION

Field of the Invention

The present disclosure relates to an organic light emitting display device, and more particularly, to an organic light emitting display device including a voltage supply line structure which can improve luminance uniformity of the organic light emitting display device by reducing a deviation in a potential difference between an anode and a cathode depending on a position of an active area of the organic light emitting display device when the organic light emitting display device is enlarged.

Description of the Related Art

As the age of information technology has proceeded, the field of display devices for visually displaying electrical information signals has grown rapidly. Thus, studies for developing technologies, such as thinning, weight lightening, and low power consumption, of various flat panel display devices have continued. Representative examples of the flat panel display devices include a Liquid Crystal Display (LCD) device, a Plasma Display Panel (PDP) device, a Field Emission Display (FED) device, an Electro-Wetting Display (EWD) device, an Organic Light Emitting Display (OLED) device, and the like.

An organic light emitting display device is a self-light emitting display device that does not need a separate light source unlike a liquid crystal display, and thus, the organic light emitting display device can be manufactured in a lightweight and thin form. Further, the OLED is advantageous in terms of power consumption since it is driven with a low voltage. Also, the organic light emitting display device has excellent color expression ability, a high response speed, a wide viewing angle, and a high contrast ratio (CR). Therefore, the OLED has attracted attention as a next-generation display device.

An active area (AA) of the organic light emitting display device includes a plurality of sub-pixels. Each of the sub-pixels includes an organic light emitting diode (OELD). Each organic light emitting diode includes an anode, an organic light emitting layer, and a cathode. An anode voltage ELVDD is supplied to the anode, and a cathode voltage ELVSS is supplied to the cathode.

If the organic light emitting display device is of a top-emission type, the cathode uses a transparent or translucent electrode in order to upwardly emit light emitted from the organic light emitting layer. The cathode is formed to have small thickness in order to secure transparency. Therefore, resistance of the cathode becomes very high.

In order to secure the reliability of the display device, an encapsulation part configured to protect the organic light emitting layer against moisture, a physical shock, or impurities which may be generated during a manufacturing process is formed on an organic light emitting element including the organic light emitting layer. In the top-emission organic light emitting display device, a glass encapsulation part, or an encapsulation part having a thin film encapsulation structure in which an inorganic encapsulation layer and an organic layer for delaying infiltration of moisture is used as the encapsulation part.

As a size of the top-emission organic light emitting display device is increased, a length of a line for supplying a voltage is also increased. A line resistance applied to each of the sub-pixels is increased in proportion to the length of the line. Therefore, there is a difference in voltage transmitted along the line for each sub-pixel. Accordingly, luminance uniformity of the organic light emitting display device is decreased.

SUMMARY OF THE INVENTION

In recent years, a high-density and high-resolution organic light emitting display device has been demanded. Further, various compensation circuits to be added to an active area have been demanded in order to improve an image quality of an organic light emitting display device. Therefore, when an anode line for supplying an anode voltage ELVDD and a cathode line for supplying a cathode voltage ELVSS are disposed in an organic light emitting display device, it is difficult to secure a sufficient width for line.

The inventors of the present disclosure have continued various studies for improving a decrease in image luminance uniformity which worsens as a top-emission organic light emitting display device is increased in size. To be specific, the inventors have continued on research and development of a disposition structure of a cathode line and an anode line for reducing a problem of a line resistance.

To be specific, the inventors have studied a new disposition structure of voltage supply lines capable of improving uniformity in a potential difference between an anode and a cathode applied to each sub-pixel even if voltage is decreased due to a line resistance.

In particular, the inventors noted the fact that an anode voltage ELVDD is gradually decreased as a length of a line from a voltage supply source is increased, whereas a cathode voltage ELVSS is gradually increased as a length of a line from a voltage supply source is increased.

The inventors of the present disclosure invented an organic light emitting display device capable of uniformly improving a potential difference between an anode and a cathode by optimizing an input direction of an anode voltage ELVDD supply line and an input direction of a cathode voltage ELVSS supply line.

Thus, an object of the present disclosure is to provide an organic light emitting display device which can be uniformity improved in a potential difference between an anode and a cathode by providing a voltage supply line structure which has a uniform line resistance regardless of a position of a sub-pixel since an input direction of an anode line for supplying an anode voltage ELVDD and an input direction of a cathode line for supplying a cathode voltage ELVSS are opposite to each other.

Another object of the present disclosure is to provide an organic light emitting display device including a voltage supply line and a voltage supply pad which can be applied to an organic light emitting display device having light transparency by optimizing a voltage supply line structure.

The objects of the present disclosure are not limited to the aforementioned objects, and other objects, which are not mentioned above, will be apparent to a person having ordinary skill in the art from the following description.

Yet another object of the present invention is to provide an organic light emitting display device including sub-pixel structures respectively optimized for the above-described voltage supply line structures, and an image signal compensation unit corresponding to the sub-pixel structures.

Still another object of the present invention is to provide an organic light emitting display device including a transmission unit having light transparency optimized for the above-described sub-pixel structures.

According to an aspect of the present disclosure, there is provided an organic light emitting display device. The organic light emitting display device includes: a plurality of sub-pixels including an anode and a cathode; an anode line configured to supply an anode voltage to the anode; and a cathode line configured to supply a cathode voltage to the cathode, and in each of the plurality of sub-pixels, a direction of an anode voltage input of the anode line and a direction of a cathode voltage input of the cathode line are different from each other and face each other in order to reduce a deviation in a potential difference between the anode and the cathode. Thus, it is possible to improve uniformity in the potential difference between the anode and the cathode caused by a line resistance.

According to another feature of the present disclosure, the organic light emitting display device is configured such that the anode voltage in the anode line is gradually decreased along the direction of the anode voltage input, the organic light emitting display device is configured such that the cathode voltage in the cathode line is gradually increased along the direction of the cathode voltage input, and a degree of decrease in the anode voltage in the anode line according to a distance and a degree of increase in the cathode voltage in the cathode line according to a distance is set by a line resistance of the anode line and the cathode line, respectively.

According to yet another feature of the present disclosure, the organic light emitting display device is configured to resolve the problem of the deviation in the potential difference between the anode and the cathode in the plurality of sub-pixels by offsetting the increased cathode voltage in the cathode line by the decreased anode voltage in the anode line.

According to still another feature of the present disclosure, the line resistance of the anode line and the line resistance of the cathode line have a difference of less than 10%.

According to still another feature of the present disclosure, the organic light emitting display device further includes: an active area including the plurality of sub-pixels; and a peripheral area configured to surround the active area, where the anode line is extended from an edge of the peripheral area to the other edge facing the edge so as to be connected with the plurality of sub-pixels, and the cathode line is extended from the other edge of the peripheral area to the edge facing the other edge so as to be connected with the plurality of sub-pixels.

According to still another feature of the present disclosure, the anode line and the cathode line include one-way input lines, and the anode line and the cathode line are short-circuited at a dead-end of the active area.

According to still another feature of the present disclosure, the anode line and the cathode line are formed in a comb shape, and the anode line and the cathode line are configured such that comb teeth line segments are disposed to cross each other in the active area.

According to another aspect of the present disclosure, there is provided an organic light emitting display device.

The organic light emitting display device includes: an active area including a plurality of sub-pixels; a peripheral area configured to surround the active area; an anode line disposed from a first edge of the peripheral area and extended towards a second edge opposing the first edge so as to supply an anode voltage from the first edge of the peripheral area towards the second edge to the active area; and a cathode line disposed from the second edge of the peripheral area and extended towards the first edge so as to supply a cathode voltage from the second edge of the peripheral area towards the first edge to the active area. Thus, it is possible to improve uniformity in a potential difference between an anode and a cathode caused by a line resistance.

According to another feature of the present disclosure, each of the plurality of sub-pixels includes: a driving transistor including an active layer, a gate electrode, a source electrode, and a drain electrode; a data line configured to apply an image signal to the driving transistor; and an organic light emitting diode driven by the driving transistor including an anode, an organic light emitting layer, and a cathode, and the data line is electrically connected with the gate electrode of the driving transistor, where the anode line is electrically connected with the drain electrode of the driving transistor, and the cathode line is electrically connected with the cathode of the organic light emitting diode.

According to yet another feature of the present disclosure, the image signal applied to the driving transistor through the data line is an image signal modified to compensate a voltage Vgs according to an increment in cathode voltage in the cathode of each of the plurality of sub-pixels.

According to yet another feature of the present disclosure, the image signal may be compensated proportionally to the increment in the cathode voltage.

According to still another feature of the present disclosure, the plurality of sub-pixels further include a light transmission part for providing light transparency.

According to still another feature of the present disclosure, the organic light emitting display device further includes: at least one circuit board, where at least one circuit board is disposed so as not to be overlapped with a rear surface of the active area.

According to still another feature of the present disclosure, one of the anode line and the cathode line is configured to surround the peripheral area, and the anode line and the cathode line are configured to receive voltages from the same edge of the peripheral area.

According to still another feature of the present disclosure, the organic light emitting display device further includes: a jump line, and the anode line and the cathode line are formed of the same material. One of the anode line and the cathode line is divided into at least two parts in the peripheral area, and the line divided into at least two parts is connected by the jump line.

According to still another feature of the present disclosure, the cathode line includes at least two metal layers, and at least the two metal layers are connected with each other through a contact hole.

Details of other example embodiments will be included in the detailed description of the invention and the accompanying drawings.

The present disclosure has an effect of improving luminance uniformity of an organic light emitting display device since an input direction of an anode line for supplying an anode voltage ELVDD and an input direction of a cathode line for supplying a cathode voltage ELVSS are opposite to each other.

Further, the present disclosure has an effect of improving luminance uniformity of an organic light emitting display device since a unit line resistance of an anode line and a unit line resistance of a cathode line are set to be substantially equal to each other.

Furthermore, the present disclosure has an effect of providing a voltage supply line structure which can be applied to an organic light emitting display device having light transparency since various circuit boards are disposed only at a first side surface of a peripheral area of an organic light emitting display panel and a single voltage supply line is extended from the first side surface to a third side surface through the peripheral area.

Also, the present disclosure has an effect of further improving luminance uniformity with the image signal compensation unit.

The effects of the present disclosure are not limited to the aforementioned effects, and other various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
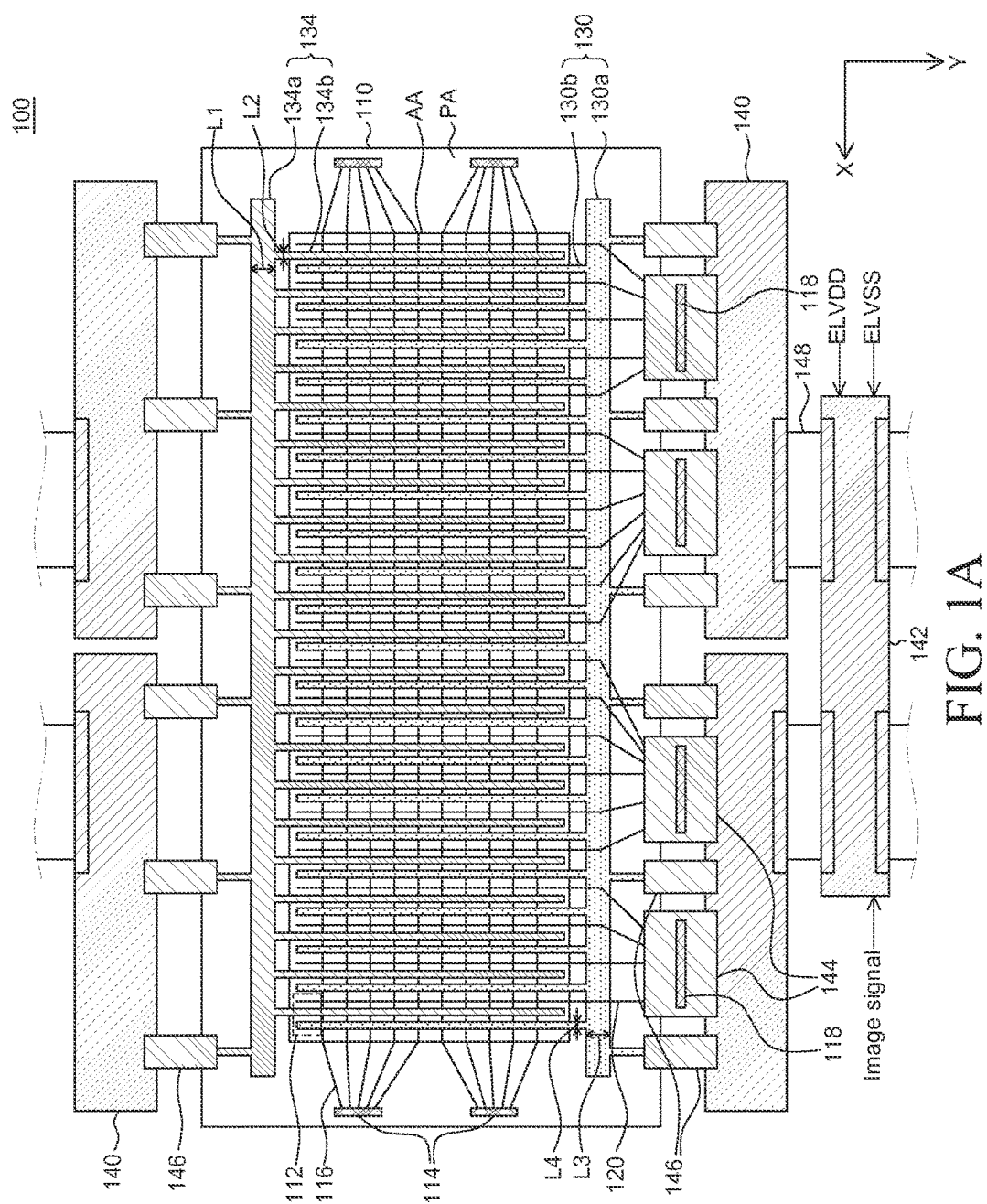
FIG. 1A is a schematic plan view of an organic light emitting display device according to an example embodiment of the present disclosure.

Advantages and features of the present disclosure, and methods for accomplishing the same will be more clearly understood from example embodiments described below with reference to the accompanying drawings. However, the present disclosure is not limited to the following example embodiments but may be implemented in various different forms. The example embodiments are provided only to complete disclosure of the present disclosure and to fully provide a person having ordinary skill in the art to which the present disclosure pertains with the category of the invention, and the present disclosure will be defined by the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Various example embodiments of the present disclosure will be described in detail with reference to the accompanying drawings.

Figure 1B:
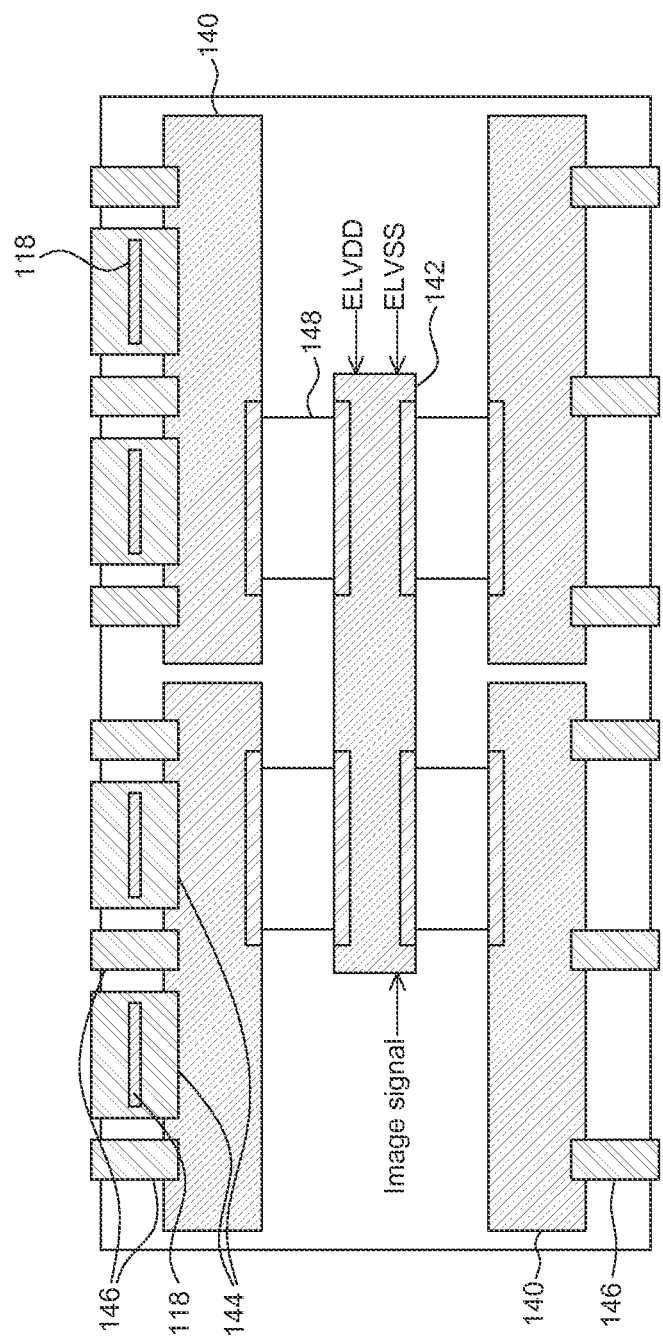
FIG. 1B is a schematic plan view provided to describe disposition positions of circuit boards at a rear surface of the organic light emitting display device according to the example embodiment of the present disclosure.

FIG. 1A and FIG. 1B are schematic plan views of an organic light emitting display device according to an example embodiment of the present disclosure.

Referring to FIG. 1A and FIG. 1B, an organic light emitting display device 100 according to an example embodiment of the present disclosure includes an organic light emitting display panel 110, a data circuit board 140, a control circuit board 142, a first flexible circuit board 144, a second flexible circuit board 146, and a flexible cable 148.

The control circuit board 142 is electrically connected with the data circuit board 140 by the flexible cable 148. The data circuit board 140 is electrically connected with the organic light emitting display panel 110 through the first flexible circuit board 144 and the second flexible circuit board 146.

1. Organic Light Emitting Display Panel

The organic light emitting display panel 110 includes an active area AA and a peripheral area PA. In the active area AA of the organic light emitting display panel 110, a plurality of sub-pixels 112 including a white sub-pixel, a red sub-pixel, a green sub-pixel, and a blue sub-pixel, a plurality of gate lines 116, a plurality of data lines 120, a plurality of second anode lines 130*b*, and a plurality of second cathode lines 134*b* are disposed, so that the active area AA is configured to display an image. The peripheral area PA of the organic light emitting display panel 110 is configured to surround the active area AA. In the peripheral area PA, various lines and circuits are disposed to drive the plurality of sub-pixels 112 of the active area AA. In the peripheral area PA, a first anode line 130*a*, a first cathode line 134*a*, and a plurality of pads are disposed, and additional circuit components can be further disposed. For example, a flexible printed circuit board (FPCB), a flexible cable, a semiconductor chip, or the like may be bonded on the plurality of pads by a bonding member. Examples of the lines which can be connected with the plurality of pads may include the plurality of gate lines 116, the plurality of data lines 120, the first anode line 130*a*, the first cathode line 134*a*, and the like.

2. Control Circuit Board

The control circuit board 142 performs a function of receiving a digital image signal, various reference voltages, and various control signals from an external system and controlling the organic light emitting display panel 110 to display an image on the organic light emitting display panel 110. In order to perform the above-described function, the control circuit board 142 may have a configuration in which circuit components such as a processor, a memory, a look-up table, a buffer, a gamma control circuit, an LVDS (low voltage differential signal) line, a connector, and a power control unit are disposed on a printed circuit board (PCB), but may not be limited thereto.

The control circuit board 142 precisely controls the image signal, a time interval and a frequency cycle of the control signals and the like so as to display the digital image signal on the organic light emitting display panel 110. In the circuit components disposed on the control circuit board 142, various image processing algorithms and the like for having various image qualities or low power consumption can be implemented.

A digital image signal input to the control circuit board 142 from the external system is an image signal including three RGB (red, green, blue) primary colors. The organic light emitting display panel 110 according to the example embodiment of the present disclosure includes the white, red, green, and blue sub-pixels 112, and thus, in the circuit components disposed on the control circuit board 142, a rendering algorithm capable of converting a RGB image signal into a WRGB (white, red, green, blue) image signal can be implemented.

A digital image signal output from the control circuit board 142 is a WRGB image signal, but may not be limited thereto. However, for convenience in explanation, only a control signal related to the present disclosure among various control signals described above will be described later in detail.

Various reference voltages output from the control circuit board 142 may include an anode voltage ELVDD, a cathode voltage ELVSS, a gamma reference voltage, an initial voltage (Vinit), a gate high voltage (VGH), a gate low voltage (VGL), an external compensation reference voltage (Vref), and the like, but may not be limited thereto. However, for convenience in explanation, only a reference voltage related to the present disclosure among various reference voltages described above will be described later in detail.

The anode voltage ELVDD refers to a voltage applied to an anode electrode in the active area AA of the organic light emitting display panel 110. The cathode voltage ELVSS refers to a voltage applied to a cathode electrode in the active area AA of the organic light emitting display panel 110. The gamma reference voltage is used when a digital image signal is converted into an analogue image signal in a data driver IC 118. The initial voltage suppresses distortion of a black scale of an image by discharging an image signal of a previous image frame that was stored in a capacitor of the sub-pixel 112 in the active area AA. The gate high voltage and the gate low voltage switches a gate driver IC on and off. The external compensation reference voltage compensates a threshold-voltage (Vth) difference of a driving transistor $D_{TR}$ of the sub-pixel 112.

Among the above-described reference voltages, the anode voltage ELVDD, the cathode voltage ELVSS, and the gamma reference voltage are important reference voltages which may directly affect an image quality of the organic light emitting display panel 110 and thus need to be uniformly and stably supplied to the organic light emitting display panel. However, this should not be construed that the other voltages do not directly affect an image quality.

Various control signals output from the control circuit board 142 may include a gate start pulse (GSP), a gate out enable (GOE), a dot clock, and the like, but may not be limited thereto. However, for convenience in explanation, only a control signal related to the present disclosure among the various control signals described above will be described later in detail.

In some example embodiments, the organic light emitting display panel may include red, green, blue, and green sub-pixels. Therefore, in the circuit components disposed on the control circuit board, a rendering algorithm capable of converting a RGB image signal into a RGBG (red, green, blue, green) image signal can be implemented.

In some example embodiments, the organic light emitting display panel may include red, green, blue, and yellow sub-pixels. Therefore, in the circuit components disposed on the control circuit board, a rendering algorithm capable of converting a RGB image signal into a RGBY (red, green, blue, yellow) image signal can be implemented.

In some example embodiments, the organic light emitting display panel may include red, green, and blue sub-pixels.

3. Flexible Cable

The flexible cable 148 electrically connects the control circuit board 142 with the data circuit board 140. The flexible cable 148 transfers the digital image signal, various reference voltages, and various control signals output from the control circuit board 142 to the data circuit board 140. One side of the flexible cable 148 is connected with a connector disposed on the control circuit board 142, and the other side thereof is connected with a connector disposed on the data circuit board 140. However, the flexible cable and the connectors are just means for electrical connection, but the present disclosure may not be limited thereto.

Referring to FIG. 1A and FIG. 1B, four connectors are disposed on the control circuit board 142, and each of the connectors is connected with each flexible cable 148. According to this configuration, the control circuit board 142 may supply various signals to an upper side surface (first side surface) and a lower side surface (third side surface) of the organic light emitting display panel 110 on the basis of a Y-axis.

Herein, the first side surface may be defined as the upper side surface, a second side surface may be defined as a left side surface, the third side surface may be defined as the lower side surface, and a fourth side surface may be defined as a right side surface.

4. Data Circuit Board

The data circuit board 140 receives the digital image signal, various reference voltages, and various control signals output from the control circuit board 142 and transfers the above-described signals and voltages to the organic light emitting display panel 110 through the first flexible circuit board 144 and the second flexible circuit board 146. In order to perform the above-described function, the data circuit board 140 includes various circuit components disposed on a printed circuit board (PCB). For example, the data circuit board 140 may be configured to include passive components such as a resistor and a capacitor in order to stabilize a gamma reference voltage which becomes a basis for generating an analogue image signal of the data driver IC 118. Further, the data circuit board 140 may be configured such that a line resistance of the data circuit board 140 is minimized in order to minimize a voltage drop of an anode voltage ELVDD, a cathode voltage ELVSS, and a gamma reference voltage.

Referring to FIG. 1A and FIG. 1B, the data circuit board 140 disposed on the lower side surface (or third side surface) of the organic light emitting display panel 110 in a direction of a Y-axis does not include the data driver IC 118, and thus, does not include any passive component for stabilizing a gamma reference voltage.

In some example embodiments, the control circuit board and the data circuit board may be combined into a single circuit board. In this case, the flexible cable is not needed and thus may be removed.

5. Data Driver IC

The data driver IC 118 serves as a DAC (digital to analogue converter) that converts a digital image signal into an analogue image signal so as to supply the analogue image signal to the data line 120 in the active area AA of the organic light emitting display panel 110 connected with the data driver IC 118. The data driver IC 118 is formed of a semiconductor chip and bonded on the first flexible circuit board 144 by a bonding member according to a COF (chip on film) bonding method. The data driver IC 118 in the form of a semiconductor chip has a predetermined number of controllable data lines or channels, and the number of data driver ICs 118 may be determined by the number of the data lines 120 of the organic light emitting display panel 110 and the number of the channels of the data driver IC 118. However, the number of data driver ICs 118 may not be limited thereto.

The data driver IC 118 converts a digital image signal transferred from the control circuit board 142 into an analogue image signal using a gamma reference voltage in order to display a gray scale of an image signal on the sub-pixel 112. The data driver IC 118 is supplied with the gamma reference voltage from the data circuit board 140. The analogue image signal is generated using the gamma reference voltage. Preferably, the image signal has a gamma curve with a gamma value of 2.2, but may not be limited thereto.

The sub-pixel 112 includes red, green, and blue color filters and an organic light emitting layer that emits a white light. In particular, according to this configuration, organic light emitting layers are the same regardless of a color of a sub-pixel, and thus, the sub-pixel 112 may be configured such that gamma curves for the respective colors are the same, but may not be limited thereto. The sub-pixel 112 may be configured to have an independent gamma curve for each color.

An anisotropic conductive film (ACF) is used as the bonding member. In particular, as the organic light emitting display panel 110 is vulnerable to high temperature, it is difficult to perform typical soldering thereto. Thus, it is desirable to use an anisotropic conductive film. In the anisotropic conductive film, conductive particles are dispersed, and bonded to each other by heat and pressure. Herein, a film layer of the anisotropic conductive film retains an adhesive strength between the plurality of pads and the semiconductor chip, and the dispersed conductive particles electrically connect the plurality of pads with the semiconductor chip at a bonding area. However, the bonding member may not be limited thereto.

In some example embodiments, the plurality of sub-pixels of the organic light emitting display panel may be formed to include red, green, and blue organic light emitting layers configured to emit red, green, and blue lights, respectively. Herein, color filters can be removed. If the organic light emitting layers are different from each other, electrical characteristics of the organic light emitting layers are different from each other. Thus, a gamma voltage needs to be set differently for each color of each sub-pixel.

6. First Flexible Circuit Board

The first flexible circuit board 144 includes the data driver IC 118 and electrically connects the data circuit board 140 with the organic light emitting display panel 110. One side surface of the first flexible circuit board 144 is bonded to the organic light emitting display panel 110, and the other side thereof is bonded to one side of the data circuit board 140. The data driver IC 118 is bonded to a central area of the first flexible circuit board 144. The first flexible circuit board 144 includes a plurality of pads on the one side surface, a plurality of pads on the other side surface, and a plurality of pads on the central area. That is, the first flexible circuit board 144 has a COF (chip on film) shape in which a semiconductor chip is disposed on a film. A bonding member is disposed on the plurality of pads. As the bonding member, an anisotropic conductive film is used. However, the bonding member may not be limited thereto.

7. Second Flexible Circuit Board

The second flexible circuit board 146 electrically connects the data circuit board 140 with the organic light emitting display panel 110, and supplies at least one reference voltage to the organic light emitting display panel 110. One side surface of the second flexible circuit board 146 is bonded to the organic light emitting display panel 110, and the other side surface thereof is bonded to one side surface of the data circuit board 140. The second flexible circuit board 146 includes a plurality of pads on the one side surface and a plurality of pads on the other side surface. That is, the second flexible circuit board 146 has a FOG (film on glass) shape in which electric lines are formed on a film. A bonding member is disposed on the plurality of pads. As the bonding member, an anisotropic conductive film is used. However, the bonding member may not be limited thereto.

To be specific, the second flexible circuit board 146 receives an anode voltage ELVDD or a cathode voltage ELVSS from the data circuit board 140 and supplies the voltage to the plurality of sub-pixels 112 disposed in the active area AA of the organic light emitting display panel 110.

In order to improve luminance uniformity of the organic light emitting display panel 110, the anode voltage ELVDD and the cathode voltage ELVSS need to be stable. Therefore, in order to minimize a line resistance of a voltage supply line of the second flexible circuit board 146, the voltage supply line is formed to have a total width that is sufficiently large. Herein, the voltage supply line may be implemented as being divided into a plurality of narrow lines. If a line resistance is high and a potential difference between the anode voltage ELVDD and the cathode voltage ELVSS is not uniform in the active area AA, brightness of an image displayed on the organic light emitting display panel 110 is different in each active area AA. In order to solve this problem, a plurality of second flexible circuit boards 146 may be disposed in the peripheral area PA of the organic light emitting display panel 110. Herein, preferably, the second flexible circuit boards 146 may be separated from each other by a predetermined gap. According to the above-described configuration, it is possible to distribute a current capacity which can flow through each flexible circuit board, and thus, there is an advantage of reducing heat generation or burning caused by an overcurrent.

In some example embodiments, the data driver IC may be bonded on a plurality of pads disposed in the peripheral area PA of the organic light emitting display panel according to a COG (chip on glass) bonding method. Herein, the first flexible circuit board does not include a plurality of pads on the central area and electrically connects the data circuit board with the organic light emitting display panel and transfers an image signal transferred from the data circuit board to the data driver IC. If the data driver IC is disposed in a COG (chip on glass) shape, the data driver IC does not need to be disposed on the first flexible circuit board. Thus, the first flexible circuit board may have a FOG shape.

In some example embodiments, both of the first flexible circuit substrate and the second flexible circuit substrate may be configured to receive an anode voltage ELVDD and a cathode voltage ELVSS from the data circuit board. Herein, the first flexible circuit board includes the data driver IC. If both of the first flexible circuit substrate and the second flexible circuit substrate are configured to receive an anode voltage ELVDD and a cathode voltage ELVSS, it is possible to more uniformly distribute a current capacity which can flow through each flexible circuit board, and thus, there is an advantage of further reducing heat generation or burning caused by an overcurrent.

In some example embodiments, the first flexible circuit substrate and the second flexible circuit substrate may be alternately disposed along the upper side surface (first side surface) of the organic light emitting display panel 110. The alternately disposed flexible circuit boards can alleviate a problem of an overcurrent flowing to a specific flexible circuit board.

In some example embodiments, a combined flexible circuit board in which the first flexible circuit substrate and the second flexible circuit substrate are combined may be disposed. That is, the first flexible circuit substrate and the second flexible circuit substrate can be combined or separated in various forms if necessary.

8. Gate Driver IC

Agate driver IC 114 supplies a gate line driving signal to the plurality of gate lines 116 connected to the plurality of sub-pixels 112 of the organic light emitting display panel 110. The control circuit board 142 generates a driving signal for driving the gate driver IC 114 and supplies the driving signal to the gate driver IC 114. The gate driver IC 114 is disposed in the peripheral area PA of the organic light emitting display panel 110. To be specific, the gate driver IC 114 is disposed on both side surfaces (the second side surface and the fourth side surface) of the organic light emitting display panel 110. In particular, according to this configuration, both side surfaces (the second side surface and the fourth side surface) can apply gate line driving signals, and thus, there is an effect of alleviating a decrease in quality of a gate line driving signal in a large organic light emitting display panel in which the gate lines 116 are increased in length.

The gate driver IC 114 is formed of a semiconductor chip and bonded on the plurality of pads disposed in the peripheral area PA of the organic light emitting display panel 110 by a COG (chip on glass) bonding method. The gate driver IC 114 in the form of a semiconductor chip has a predetermined number of controllable gate lines or channels, and the number of gate driver ICs 114 may be determined by the number of the gate lines 116 of the organic light emitting display panel 110 and the number of the channels of the gate driver IC 114. However, the number of gate driver ICs 114 may not be limited thereto. An anisotropic conductive film may be used as a bonding member. However, the bonding member may not be limited thereto.

9. Sub-Pixel

Figure 1C:
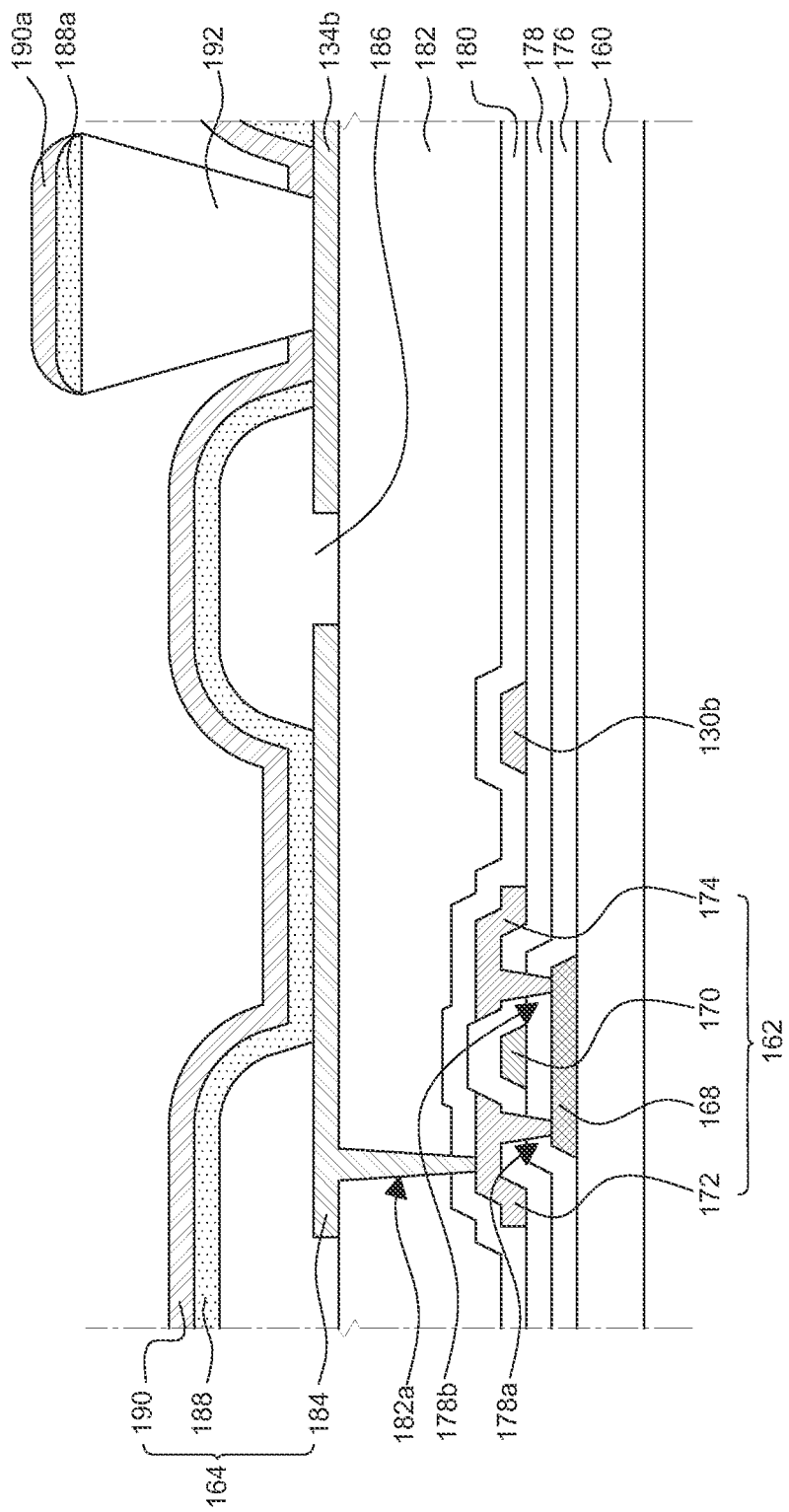
FIG. 1C is a schematic cross-sectional view of a sub-pixel of the organic light emitting display device according to the example embodiment of the present disclosure.

Referring to FIG. 1C, the sub-pixel 112 in the active area AA includes at least a first substrate 160, a driving transistor 162 disposed on the first substrate 160, an organic light emitting diode 164 driven by the driving transistor 162, the second anode line 130b, and the second cathode line 134b.

The first substrate 160 is formed of a material suitable for deposition of a semiconductor layer, a metal layer, an organic thin film, an inorganic thin film, or the like. For example, glass or plastic such as polyimide having excellent thermal and chemical resistance may be applied to the first substrate 160.

The driving transistor 162 according to an example embodiment of the present disclosure has an N-type structure. The driving transistor 162 according to an example embodiment of the present disclosure has a coplanar structure.

The driving transistor 162 includes an active layer 168, a gate electrode 170, a source electrode 172, and a drain electrode 174.

The active layer 168 is disposed on the first substrate 160. The active layer 168 is formed of a material having a semiconductor characteristic. For example, amorphous silicon, low-temperature polysilicon, an oxide substance, an organic substance, or the like may be applied to the active layer 168. However, the present disclosure may not be limited thereto.

A gate insulating film 176 is disposed on the active layer 168. The gate insulating film 176 is configured to cover the active layer 168. The gate insulating film 176 is formed of an inorganic substance. For example, silicon oxide (SiOx), silicon nitride (SiNx), aluminum oxide ($Al_2O_3$), or the like may be applied to the gate insulating film 176. However, the present disclosure may not be limited thereto.

The gate electrode 170 is disposed on the gate insulating film 176. Further, the gate electrode 170 is configured to be overlapped with at least a partial area of the active layer 168. The gate electrode 170 is formed of metal. The gate electrode 170 may be formed of the same material as that of the gate lines 116. For example, copper (Cu), aluminum (Al), silver (Ag), molybdenum (Mo), titanium (Ti), gold (Au), transparent conductive oxide (TCO), laminates thereof, or the like may be applied to the gate electrode 170. However, the present disclosure may not be limited thereto.

An interlayer insulating film 178 is disposed on the gate electrode 170. The interlayer insulating film 178 is configured to cover the gate electrode 170. The interlayer insulating film 178 is formed of an inorganic substance. For example, silicon oxide, silicon nitride, aluminum oxide, or the like may be applied to the interlayer insulating film 178. Otherwise, the interlayer insulating film 178 may have a double-layer structure formed of silicon oxide and silicon nitride. However, the present disclosure may not be limited thereto.

The source electrode 172 and the drain electrode 174 are disposed on the interlayer insulating film 178. The source electrode 172 and the drain electrode 174 are configured to be electrically connected with the active layer 168. To be specific, the source electrode 172 is connected with one end of the active layer 168 through a first contact hole 178a penetrating the gate insulating film 176 and the interlayer insulating film 178. Further, the drain electrode 174 is connected with the other end of the active layer 168 through the first contact hole 178a penetrating the gate insulating film 176 and the interlayer insulating film 178. The source electrode 172 and the drain electrode 174 are formed of metal. The source electrode 172 and the drain electrode 174 may be formed of the same material as that of the data lines 120. For example, copper (Cu), aluminum (Al), silver (Ag), molybdenum (Mo), titanium (Ti), gold (Au), transparent conductive oxide (TCO), laminates thereof, or the like may be applied to the source electrode 172 and the drain electrode 174. However, the present disclosure may not be limited thereto.

The second anode line 130b is disposed on the interlayer insulating film 178. The second anode line 130b supplies an anode voltage ELVDD to the active area AA. To be specific, the second anode line 130b is configured to be electrically connected with the drain electrode 174 of the driving transistor 162. The second anode line 130b is electrically connected with the first anode line 130a disposed in the peripheral area PA, thereby constituting an anode line 130. According to the above-described configuration, the anode voltage ELVDD is supplied to the driving transistor 162 through the anode line 130. The second anode line 130b may be formed of the same material as that of the data lines 120. However, the present disclosure may not be limited thereto.

A transistor insulating film 180 is disposed on the driving transistor 162. The transistor insulating film 180 is formed of an inorganic substance. For example, silicon oxide, silicon nitride, aluminum oxide, or the like may be applied to the transistor insulating film 180. However, the present disclosure may not be limited thereto. The transistor insulating film 180 may additionally suppress infiltration of moisture into the driving transistor 162.

An organic layer 182 is disposed on the transistor insulating film 180. The organic layer 182 is formed of an organic substance having a low permittivity ($\epsilon$). Therefore, the organic layer 182 can reduce a parasitic capacitance generated between an anode 184 and the driving transistor 162 and between the gate line 116 and a data line 115. For example, photo acryl and the like may be applied to the organic layer 182. However, the present disclosure may not be limited thereto. Further, the organic layer 182 may planarize step portions formed by various components of the driving transistor 162.

The organic light emitting diode 164 includes the anode 184, a cathode 190, and an organic light emitting layer 188 interposed therebetween. A light emitting area of the organic light emitting layer 188 may be defined by a bank 186.

The anode 184 is disposed on the organic layer 182. The anode 184 is configured to correspond to a light emitting area of each sub-pixel 112. A second contact hole 182a is configured to penetrate the organic layer 182 and the transistor insulating film 180. Therefore, the anode 184 is connected with the source electrode 172 of the driving transistor 162 through the second contact hole 182a. The anode 184 is formed of a material having a high work function. The anode 184 may be formed of a reflective material so as to have reflectivity, or may include a reflective plate at a lower part thereof.

The anode 184 including a reflective plate will be described for convenience in explanation. The reflective plate is formed of a metallic material having a high reflectivity to visible light. For example, silver (Ag) or an alloy such as APC may be applied to the anode 184. However, the present disclosure may not be limited thereto. A current corresponding to an image signal is applied to the anode 184 by the driving transistor 162.

The bank 186 is disposed on the organic layer 182. The bank 186 is configured to surround each sub-pixel 112. The bank 186 is configured to have a taper shape. The bank 186 is configured to be overlapped with at least a part of an edge of the anode 184. The bank 186 is formed of an organic substance. For example, photo acryl, polyimide, or the like may be applied to the bank 186. However, the present disclosure may not be limited thereto.

The organic light emitting layer 188 is disposed on the anode 184. The organic light emitting layer 188 is configured to be entirely deposited in the active area AA. The organic light emitting layer 188 may be formed of a phosphorescent or fluorescent material, and may further include an electron transporting layer, a hole transporting layer, a charge generating layer, and the like.

The cathode 190 is disposed on the organic light emitting layer 188. The cathode 190 is formed of a metallic material having a low work function or transparent conductive oxide (TCO) with a very small thickness. The cathode 190 is formed to have a thickness of 1500 Å or less, preferably, 400 Å or less. If the cathode 190 is formed to have such thickness, the cathode 190 becomes substantially a semi-transmission and transparent layer. However, such a cathode 190 has a high electrical resistance. Therefore, the cathode 190 is configured to be electrically connected with the second cathode line 134b adjacent thereto.

A partition wall 192 is disposed to be adjacent to the sub-pixel 112. The partition wall 192 is formed into a reverse-taper shape. The reverse-taper shape refers to a shape in which a width of the partition wall 192 is increased as the partition wall 192 is upwardly away from a substrate 101. The partition wall 192 is disposed within an opening part of the bank 186. Such an opening part may be referred to as a "contact area C/A". A bottom surface of the partition wall 192 is in contact with a partial area of the second cathode line 134b, and an area of a top surface of the partition wall 192 is larger than an area of the bottom surface of the partition wall 192. Therefore, a lower part of the partition wall 192 that is shaded by the reverse-taper shape of the partition wall 192 is formed.

The partition wall 192 is configured to be thicker than the bank 186. If the partition wall 192 is thicker than the bank 186, it may be easier to form the partition wall 192 into a reverse-taper shape.

Generally, an organic light emitting layer is formed of a material having a low step coverage. Due to the step coverage of the organic light emitting layer, the organic light emitting layer is not deposited on a part shaded by the reverse-taper shape of the partition wall 192 and a side surface of the partition wall 192, and the organic light emitting layer is deposited on top surfaces of the partition wall 192 and the bank 186. Therefore, a physical space in which the second cathode line 134b and the cathode 190 can be electrically connected can be secured between the side surface of the partition wall 192 and the side surface of the bank 186. Further, a residue 188a of the organic light layer remains on the partition wall 192.

The cathode 190 may be in direct contact with a top surface of the second cathode line 134b exposed between the side surface of the partition wall 192 and the side surface of the bank 186 in the contact area C/A. Since the transparent conductive oxide constituting the cathode 190 has a high step coverage, the cathode 190 can be in contact with the second cathode line 134b exposed between the side surface of the partition wall 192 and the side surface of the bank 186. Thus, the cathode 190 and the second cathode line 134b are electrically connected with each other.

In some example embodiments, a multi-buffer layer formed of silicon nitride (SiNx) and silicon oxide (SiOx) may be further disposed between the first substrate 160 and the driving transistor 162. Since the multi-buffer layer is disposed, it is possible to protect the driving transistor 162 against impurities and the like on the first substrate 160 and also possible to protect the driving transistor 162 against moisture and oxygen.

In some example embodiments, the driving transistor 162 may have an inverted-staggered structure.

In some example embodiments, the driving transistor 162 may be configured to have a P-type structure. In this case, positions of the drain electrode 174 and the source electrode 172 of the driving transistor 162 are reversed. Further, a position of the capacitor is also changed accordingly.

In some example embodiments, the transistor insulating film 180 may be removed.

In some example embodiments, a lens for improving light extraction efficiency may be additionally formed on the organic layer 182 in an area where the anode 184 is disposed.

In some example embodiments, a spacer may be further disposed on the bank 186. The spacer may be formed of the same material as that of the bank 186.

In some example embodiments, a partition wall may be disposed on a bank. In this case, an island-shaped bank may be further disposed on a central part of a contact area, and a partition wall may be disposed on the island-shaped bank.

In some example embodiments, a partition wall may be removed. In this case, an organic light emitting layer may be configured so as not to be entirely deposited, and an area corresponding to a contact area is patterned by a mask.

10. First Anode Line

Referring to FIG. 1A again, the anode line 130 includes the first anode line 130a and the second anode line 130b. The anode line 130 is formed into a comb shape.

The first anode line 130a of the anode line 130 is disposed along the upper side surface (first side surface) in the peripheral area PA of the organic light emitting panel 110. For example, the first anode line 130a is disposed along the direction of an X-axis as a major side surface direction of the organic light emitting panel 110.

The first anode line 130a is supplied with an anode voltage ELVDD from the second flexible circuit board 146 and supplies the anode voltage ELVDD to the second anode line 130b.

The first anode line 130a includes an extended pad portion of which a part is bonded to the second flexible circuit board 146. The extended pad portion of the first anode line 130a is bonded to the second flexible circuit board 146 by a bonding member, namely an anisotropic conductive film. However, the bonding member may not be limited thereto.

The first anode line 130a is configured to have a relatively larger width than that of the various lines disposed in the active area AA in order to minimize a line resistance. For example, a width L1 of the first anode line 130a may be 1 mm to 3 mm. Therefore, a difference in line resistance depending on a distance is negligible. According to the above-described configuration, when a size of the organic light emitting display panel 110 is increased, a voltage drop caused by a line resistance of the first anode line 130a can be minimized.

A line resistance of the first anode line 130a is relatively very low and thus explanation thereof will be omitted hereinafter. However, this does not mean that a resistance of the first anode line 130a is 0Ω.

The first anode line 130a may be formed by using some lines selected from various lines constituting the sub-pixel 112 of the organic light emitting display panel 110. For example, the first anode line 130a may be formed of copper (Cu), aluminum (Al), silver (Ag), molybdenum (Mo), titanium (Ti), gold (Au), transparent conductive oxide (TCO) or laminates thereof.

The first anode line 130a is formed of the same material as that of the data line 120. Although not illustrated in detail in FIG. 1A, the data line 120 is formed of the same material as that of the first anode line 130a, and thus, they cannot be disposed on the same plane. If they are be disposed on the same plane, an electrical short may occur. Therefore, in an area where the data line 120 and the first anode line 130a are overlapped, a jump line using a separate metal layer is formed. For example, a jump line in the area where the first anode line 130a and the data line 120 are overlapped may be formed of the same material as that of the gate line 116. Further, the jump line may be configured to be electrically insulated by an insulating layer. The insulating layer may be configured using, for example, an interlayer insulating film, a gate insulating film, or the like.

A line resistance RLine will be described in detail. Each line is formed of a unique conductive material. Each conductive material has a resistivity ρ. Further, the line resistance RLine is determined by a resistivity ρ, a length L of the line, a thickness T of the line, and a width W of the line. The line resistance can be calculated by Equation 1.

Line resistance=Length×resistivityρ/Thickness×Width    [Equation 1]

11. First Cathode Line

A cathode line 134 includes the first cathode line 134a and the second cathode line 134b. The cathode line 130 is formed into a comb shape.

The first cathode line 134a of the cathode line 134 is disposed along the lower side surface (third side surface) opposite to the upper side surface (first side surface) in the peripheral area PA of the organic light emitting panel 110. For example, the first cathode line 134a is disposed along the direction of an X-axis as the major side surface direction of the organic light emitting panel 110. Herein, preferably, the first cathode line 134a and the first anode line 130a may be disposed to be in parallel to each other.

The first cathode line 134a is supplied with a cathode voltage ELVSS from the second flexible circuit board 146 and supplies the cathode voltage ELVSS to the plurality of second cathode lines 134b.

The first cathode line 134a includes an extended pad portion of which a part is bonded to the second flexible circuit board 146. The extended pad portion of the first cathode line 134a is bonded to the second flexible circuit board 146 by a bonding member, namely an anisotropic conductive film. However, the bonding member may not be limited thereto.

The first cathode line 134a is configured to have a relatively larger width than various lines disposed in the active area AA in order to minimize a line resistance. For example, a width L3 of the first cathode line 134a may be 1 mm to 4 mm. Therefore, a difference in line resistance depending on a distance is negligible.

A line resistance of the first cathode line 134a is relatively very low and thus explanation thereof will be omitted hereinafter. However, this does not mean that a resistance of the first cathode line 134a is 0Ω.

According to the above-described configuration, when the organic light emitting display panel 110 is increased in size, a voltage drop caused by a line resistance of the first cathode line 134a can be minimized. Hereinafter, redundant description of a line resistance will be omitted.

The first cathode line 134a may be formed by using some lines selected from various lines constituting the sub-pixel 112 of the organic light emitting display panel 110. For example, the first cathode line 134a may be formed of copper (Cu), aluminum (Al), silver (Ag), molybdenum (Mo), titanium (Ti), gold (Au), transparent conductive oxide (TCO) or laminates thereof. The first cathode line 134a is formed of the same material as that of the anode 184. Otherwise, the first cathode line 134a may be formed of the same material as that of a reflective layer of the anode 184.

12. Second Anode Line

A plurality of second anode lines 130b of the anode line 130 refer to a plurality of lines which are electrically connected with the first anode line 130a and extended to the active area AA. For example, the plurality of second anode lines 130b are configured to be extended in the direction of a Y-axis perpendicular to the first anode line 130a. That is, the plurality of second anode lines 130b are extended from the first side surface to the third side surface. In other words, the plurality of second anode lines 130b are extended from one edge of the peripheral area PA to the other edge of the peripheral area PA opposing the edge so as to be connected with the plurality of sub-pixels 112. The second anode line 130b may be formed of a material identical to or different from a material of the first anode line 130a. Further, the first anode line 130a and the second anode line 130b may be formed to have a thickness of 3000 Å to 6000 Å.

The plurality of second anode lines 130b are connected with the first anode line 130a and extended in the direction of a Y-axis in the active area AA and then short-circuited at a dead-end of the active area AA. That is, the second anode lines 130b are one-way input lines.

Preferably, the first anode line 130a may be formed of the same material as that of the data line 120. In particular, according to the above-described configuration, the second anode line 130b and the data line 120 can be disposed in parallel to each other in the direction of a Y-axis. However, the present disclosure may not be limited thereto.

Referring to FIG. 1A, the data line 120 and the second anode line 130b are separated from each other by a predetermined gap and disposed along the direction of a Y-axis. The second anode line 130b is configured to have a much smaller width than the first anode line 130a. For example, a width L2 of the second anode line 130b may be 10 μm to 100 μm, and a difference in line resistance of the second anode line 130b depending on a distance is worth considering.

This is because a degree of integration of the sub-pixels 112 in the active area AA is increased, and thus, an area allowing the width of the second anode line 130b to be increased is actually limited. Therefore, a line resistance per unit length of the second anode line 130b is greater than a line resistance per unit length of the first anode line 130a. That is, a line resistance of the second anode line 130b is considerably greater than a line resistance of the first anode line 130a.

13. Second Cathode Line

A plurality of second cathode lines 134b of the cathode line are electrically connected with the first cathode line 134a and extended to the active area AA. The plurality of second cathode lines 134b supply a cathode voltage ELVSS to the active area AA. For example, the second cathode lines 134b are configured to be extended in the direction of a Y-axis perpendicular to the first cathode line 134a. Herein, an input direction of the second cathode line 134b and an input direction of the second anode line 130b are opposite to each other. That is, a voltage input direction of the second anode line 130b and a voltage input direction of the second cathode line 134b are different from each other and face each other. Therefore, the plurality of second cathode lines 134b are extended from the third side surface to the first side surface. In other words, the plurality of second cathode lines 134b are extended from the other edge of the peripheral area PA to one edge of the peripheral area PA opposing the other edge so as to be connected with the plurality of sub-pixels 112. The second cathode line 134b may be formed of a material identical to or different from a material of the first cathode line 134a. Further, the first cathode line 134a and the second cathode line 134b may be formed to have a thickness of 800 Å to 1500 Å.

The second cathode line 134b electrically connected with the first cathode line 134a is extended in a direction opposite to the second anode line 130b so as to be electrically connected with a cathode of an organic light emitting diode of each sub-pixel 112.

The second cathode lines 134b are connected with the first cathode line 134a and extended in the direction of a Y-axis in the active area AA and then short-circuited at a dead-end of the active area AA. That is, the second cathode lines 134b are one-way input lines.

According to the above-described configuration, the second anode lines 130b and the second cathode lines 134b are extended in the opposite directions and short-circuited at the opposite sides. Further, the plurality of second anode lines 130b constituting comb teeth line segments of the comb-shaped anode line 130 and the plurality of second cathode lines 134b constituting comb teeth line segments of the comb-shaped cathode line 134 are disposed to cross each other.

Preferably, the second cathode line 134b may be formed of the same material as that of an anode of an organic light emitting diode OLED. However, the present disclosure may not be limited thereto.

Referring to FIG. 1A, the second cathode lines 134b are separated from each other by a predetermined gap and disposed along the direction of a Y-axis. The second cathode line 134b is configured to have a much smaller width than the first cathode line 134a. For example, a width L4 of the second cathode line 134b may be 10 μm to 400 μm, and a difference in line resistance depending on a distance is worth considering.

This is because a degree of integration of the sub-pixels 112 in the active area AA is increased, and thus, an area allowing the width of the second cathode line 134b to be increased is actually limited. Therefore, a line resistance per unit length of the second cathode line 134b is greater than a line resistance per unit length of the first cathode line 134a. Therefore, a line resistance of the second cathode line 134b is considerably greater than a line resistance of the first cathode line 134a.

A line resistance of the second anode line 130b may be set to be equal to a line resistance of the second cathode line 134b. The line resistances may be set by equalizing cross-section areas of the respective lines.

For example, the second anode line 130b may be configured to have a line thickness of 4500 Å and a line width of 10 μm. In this case, the second cathode line 134b may be configured to have a line thickness of 1000 Å and a line width of 45 μm. In this case, if the second anode line 130b and the second cathode line 134b are formed of the same material, since the cross-section areas of the respective lines are the same, the line resistances per unit length are also the same. If the second anode line 130b and the second cathode line 134b are formed of different materials, it is possible to set the line resistances to be equal to each other by substituting a resistivity ρ using Equation 1.

14. Equivalent Circuit of Sub-Pixel

Figure 1D:
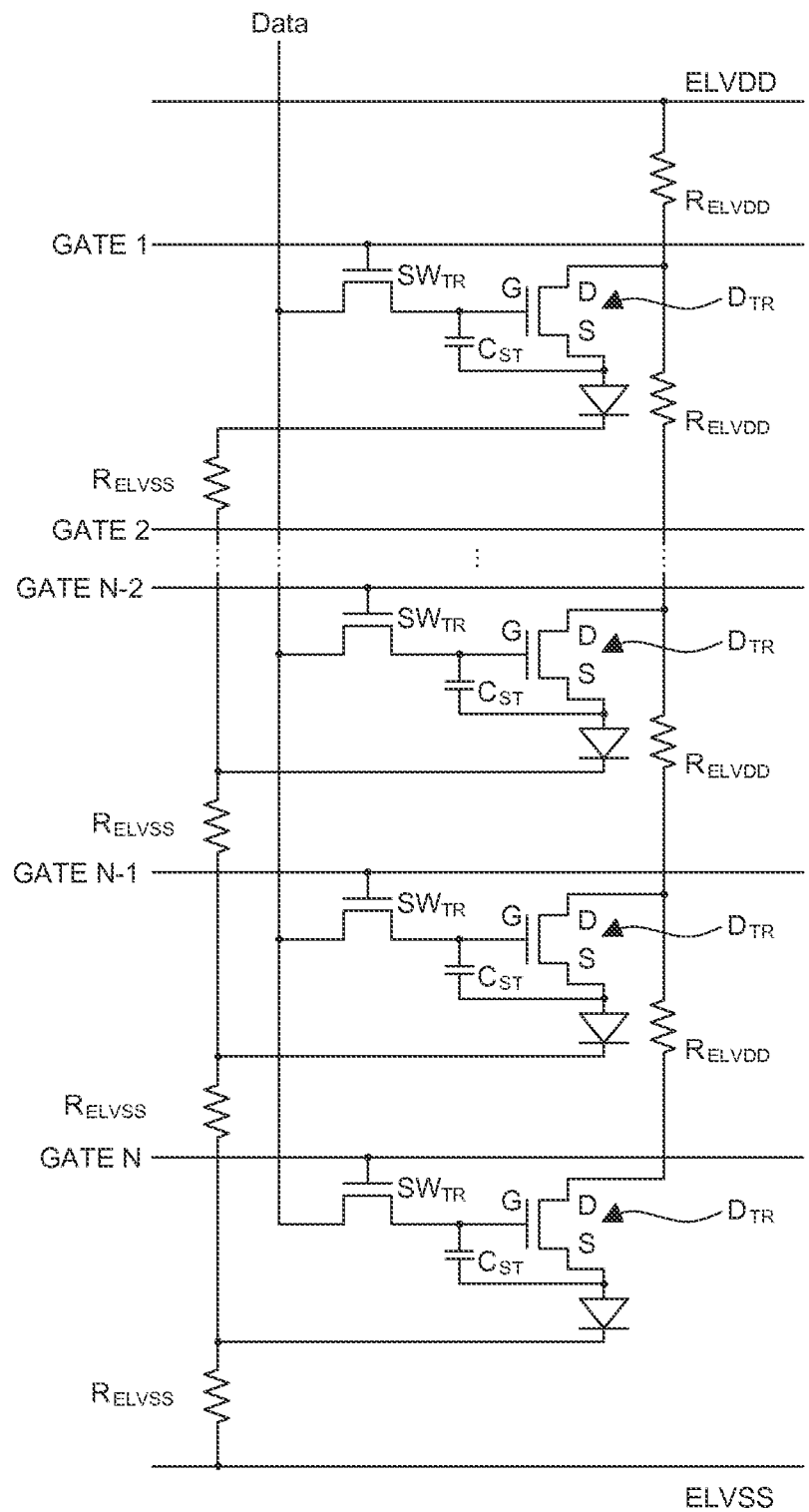
FIG. 1D is a schematic equivalent circuit diagram provided to describe a resistance value of each sub-pixel in the organic light emitting display device according to the example embodiment of the present disclosure.

Referring to FIG. 1D, an equivalent circuit of the first anode line 130a and the second anode line 130b connected with the sub-pixel 112 illustrated in FIG. 1A is schematically illustrated.

The sub-pixel 112 includes at least an organic light emitting diode, a driving transistor $D_{TR}$, a switching transistor $SW_{TR}$, a capacitor $C_{ST}$, a gate line 116 (GATE), and a data line 120 (DATA). However, it may not be limited thereto.

The sub-pixel 112 may further include an initial voltage (Vint) driver IC for discharging the capacitor $C_{ST}$, an emission duty control circuit additionally disposed between an anode of the organic light emitting diode and the driving transistor $D_{TR}$ and configured to control a duty of a voltage flowing to the anode, a threshold voltage difference compensation circuit configured to compensate a difference in a threshold voltage Vth of the driving transistor $D_{TR}$, or the like. Herein, the threshold voltage difference compensation circuit may be disposed within the sub-pixel 112 or may be disposed in the peripheral area PA. However, it may be not limited thereto.

Each driving transistor $D_{TR}$ includes a source electrode S, a drain electrode D, and a gate electrode G.

The second anode line 130b electrically connected with the first anode line 130a is extended in the direction of a Y-axis so as to be electrically connected with the drain electrode D of the driving transistor $D_{TR}$ of each sub-pixel 112. However, the above-described configuration is applied to an N-type transistor. In the case of a P-type transistor, the second anode line 130b is electrically connected with the source electrode S of the driving transistor $D_{TR}$ of each sub-pixel 112. The capacitor $C_{ST}$ is electrically connected with the gate electrode G and the source electrode S of the driving transistor $D_{TR}$.

Each data line DATA is electrically connected with the gate electrode G of each driving transistor $D_{TR}$ so as to apply an image signal to the driving transistor $D_{TR}$. The switching transistor $SW_{TR}$ is disposed between the data line DATA and the driving transistor $D_{TR}$. The data line DATA receives an analogue image signal from the data driver IC 118 and transfers the analogue image signal to the gate electrode G of the driving transistor $D_{TR}$. Herein, a current capacity flowing to the organic light emitting diode through the driving transistor $D_{TR}$ is controlled according to a voltage value of the image signal. The image signal applied to the driving transistor $D_{TR}$ through the data line DATA may be an image signal modified to compensate a voltage Vgs according to an increment in the cathode voltage in the cathode 190 of each of the plurality of sub-pixels 112.

Each gate line GATE is electrically connected with a gate electrode of each switching transistor $SW_{TR}$. A gate high voltage VGH and a gate low voltage VGL are applied through the gate line GATE so as to control the switching transistor $SW_{TR}$.

15. Line Resistance of Second Anode Line

Referring to FIG. 1D, a unit line resistance $(R_{ELVDD})$ Ω of the second anode line 130b can be defined as a line resistance $(R_{ELVDD})$Ω of the second anode line 130b corresponding to a length of one sub-pixel 112. Therefore, the total anode line resistance $(RT_{ELVDD})$Ω is increased proportionally to the number of the corresponding sub-pixels 112.

Hereinafter, the following description is made assuming that the number of the gate lines 116 of the organic light emitting display panel 110 is N (N is a positive number greater than 0).

Further, the following description is made assuming that a gate line at an Nth position is GATE N. For example, a 1st gate line is GATE 1 and a 100th gate line is GATE 100.

For example, the total anode line resistance ($RT_{ELVDD}$)Ω of the sub-pixel 112 connected with the 1st gate line GATE 1 is ($R_{ELVDD}$)×(GATE 1)Ω=(1)×($R_{ELVDD}$)Ω.

For example, the total anode line resistance ($RT_{ELVDD}$)Ω of the sub-pixel 112 connected with an (N−2)th gate line GATE N−2 is ($R_{ELVDD}$)×(GATE N−2)Ω=(N−2)×($R_{ELVDD}$)Ω.

For example, the total anode line resistance ($RT_{ELVDD}$)Ω of the sub-pixel 112 connected with an (N−1)th gate line GATE N−1 is ($R_{ELVDD}$)×(GATE N−1)Ω=(N−1)×($R_{ELVDD}$)Ω.

For example, the total anode line resistance ($RT_{ELVDD}$)Ω of the sub-pixel 112 connected with an Nth gate line GATE N is ($R_{ELVDD}$)×(GATE N)Ω=(N)×($R_{ELVDD}$)Ω.

Therefore, the total line resistance $RT_{ELVDD}$ is gradually increased as the second anode line 130b is away from the first anode line 130a. Further, as the total line resistance $RT_{ELVDD}$ is increased, an anode voltage ELVDD applied to the anode of the organic light emitting diode is decreased according to the total anode line resistance $RT_{ELVDD}$. Therefore, an anode voltage of the second anode line 130b is gradually decreased along the direction of an anode voltage input. A degree of increase in anode voltage in the second anode line 130b according to a distance may be set by a line resistance of the second anode line 130b.

16. Line Resistance of Second Cathode Line

Referring to FIG. 1D, a unit line resistance ($R_{ELVSS}$) Ω of the second cathode line 134b can be defined as a line resistance ($R_{ELVSS}$)Ω of the second cathode line 134b corresponding to a length of one sub-pixel 112.

Therefore, the total cathode line resistance ($RT_{ELVSS}$)Ω is increased proportionally to the number of the corresponding sub-pixels 112.

For example, the total cathode line resistance ($RT_{ELVSS}$)Ω of the sub-pixel 112 connected with the Nth gate line GATE N is ($R_{ELVSS}$)×(N−(GATE N)+1)Ω=(1)×($R_{ELVSS}$)Ω.

For example, the total cathode line resistance ($RT_{ELVSS}$)Ω of the sub-pixel 112 connected with the (N−1)th gate line GATE N−1 is ($R_{ELVSS}$)×(N−(GATE N−1)+1)Ω=(2)×($R_{ELVSS}$) Ω.

For example, the total cathode line resistance ($RT_{ELVSS}$)Ω of the sub-pixel 112 connected with the (N−2)th gate line GATE N−2 is ($R_{ELVSS}$)×(N−(GATE N−2)+1)Ω=(3)×($R_{ELVSS}$) Ω.

For example, the total cathode line resistance ($RT_{ELVSS}$)Ω of the sub-pixel 112 connected with the 1st gate line GATE 1 is ($R_{ELVSS}$)×(N−(GATE 1)+1)Ω=(N)×($R_{ELVSS}$)Ω.

Therefore, the total cathode line resistance $RT_{ELVSS}$ is gradually increased as the second anode line 134b is away from the first cathode line 134a. Further, as the total cathode line resistance $RT_{ELVSS}$ is increased, a cathode voltage ELVSS applied to the cathode of the organic light emitting diode is decreased according to the total cathode line resistance $RT_{ELVSS}$. Therefore, a cathode voltage of the second cathode line 134b is gradually increased along the direction of a cathode voltage input. A degree of increase in cathode voltage in the second cathode line 134b according to a distance may be set by a line resistance of the second cathode line 134b.

17. Total Line Resistance Applied to Organic Light Emitting Diode

The gate driver IC 114 of the organic light emitting display panel 110 activates a single gate line 116 in sequence. Therefore, all the gate lines other than the gate line activated in FIG. 1D are inactivated.

For example, if the 1st gate line GATE 1 is activated, the other gate lines are not operated. Therefore, the total line resistance of the second anode line 130b and the second cathode line 134b connected with the driving transistor $D_{TR}$ activated by the 1st gate line GATE 1 can be calculated as follows. The following description is made assuming that the number of the gate lines N is 1080.

For example, the total line resistance of the sub-pixel 112 connected with the 1st gate line GATE 1 is (1)×($R_{ELVDD}$)+(1081)×($R_{ELVSS}$)Ω. That is, the total second anode line resistance is a second anode unit line resistance, and the total second cathode line resistance is 1081 second cathode unit line resistances.

For example, the total line resistance of the sub-pixel 112 connected with a 100th gate line GATE 100 is (100)×($R_{ELVDD}$)+(981)×($R_{ELVSS}$)Ω. That is, the total second anode line resistance is 100 second anode unit line resistances, and the total second cathode line resistance is 981 second cathode unit line resistances.

For example, the total line resistance of the sub-pixel 112 connected with a 1080th gate line GATE 1080 is (1080)×($R_{ELVDD}$)+(1)×($R_{ELVSS}$)Ω. That is, the total second anode line resistance is 1080 second anode unit line resistances, and the total second cathode line resistance is a second cathode unit line resistance.

For example, the total line resistance of the sub-pixel 112 connected with the Nth gate line GATE N is (GATE N)×($R_{ELVDD}$)+(N−(GATE N−1)+1)×($R_{ELVSS}$)Ω. That is, the total second anode line resistance is N second anode unit line resistances, and the total second cathode line resistance is (N−(GATE N−1)+1) second cathode unit line resistances.

Herein, the second anode unit line resistance $R_{ELVDD}$ can be set to be substantially equal to the second cathode unit line resistance $R_{ELVSS}$. In this case, the total line resistance of the sub-pixel 112 connected with the Nth gate line GATE N is ($R_{ELVDD}$)×(N+1). Herein, N denotes the total number of the gate lines 116, and thus, the total line resistance of each sub-pixel 112 connected with each gate line can be continuously the same. According to the above-described configuration, the sum of the total anode line resistance $RT_{ELVDD}$ and the total cathode line resistance $RT_{ELVSS}$ applied to a certain sub-pixel 112 is uniform regardless of a position in the direction of a Y-axis. Therefore, a potential difference (ΔV) between an anode and a cathode is continuously uniform.

In some example embodiments, a difference between a unit line resistance $R_{ELVDD}$ of an anode and a unit line resistance $R_{ELVSS}$ of a cathode may be set to be less than 10% of a unit line resistance $R_{ELVDD}$ of an anode line or less than 10% of a unit line resistance $R_{ELVSS}$ of a cathode line.

Further, a difference between a line resistance of the anode line 130 and a line resistance of the cathode line 134 may be set to be less than 10% of the line resistance of the anode line 130 or less than 10% of the line resistance of the cathode line 134.

Figure 1E:
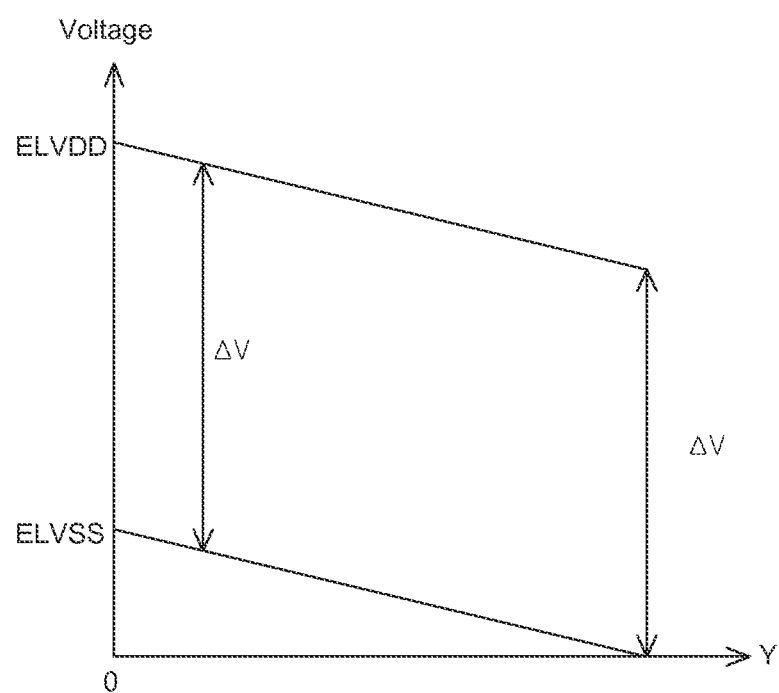
FIG. 1E is a schematic graph provided to describe a potential difference between an anode and a cathode of each sub-pixel in the organic light emitting display device according to the example embodiment of the present disclosure.

FIG. 1E is a graph provided to describe a potential difference (ΔV) between an anode and a cathode in certain sub-pixels 112 disposed in the direction of a Y-axis among the sub-pixels 112 in the active area AA of the organic light emitting display device 100 when a unit line resistance $R_{ELVDD}$ of an anode and a unit line resistance $R_{ELVSS}$ of a cathode are substantially equal to each other. Referring to FIG. 1E, it can be confirmed that a potential difference (ΔV) between an anode and a cathode of each sub-pixel 112 is continuously uniform regardless of a position in the direction of a Y-axis. That is, an increased cathode voltage of the second cathode line 134b is offset by a decreased anode voltage of the second anode line 130b, and thus, a deviation in a potential difference between the anode 184 and the cathode 190 in the plurality of sub-pixels 112 can be compensated.

Comparative Example 1

Figure 1F:
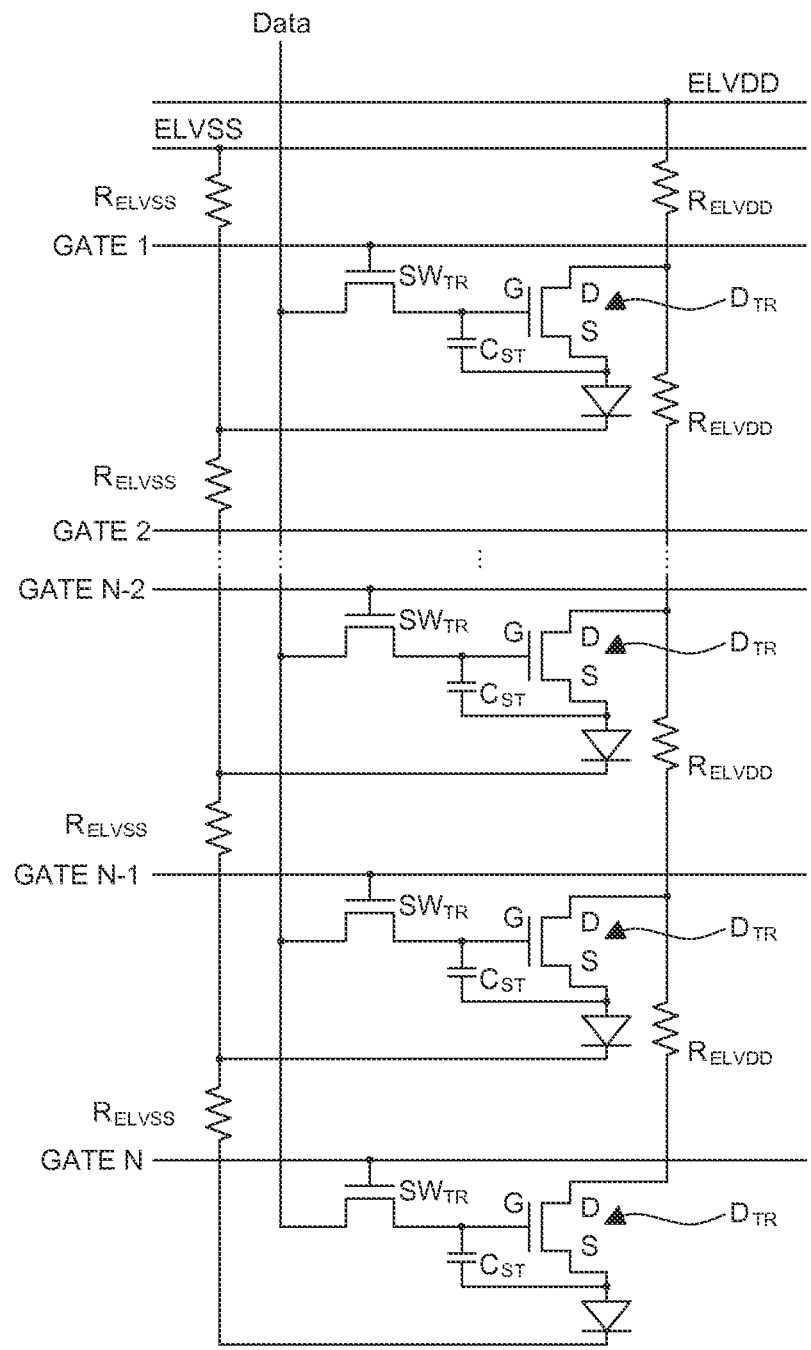
FIG. 1F is a schematic equivalent circuit diagram provided to describe a resistance value of each sub-pixel in an organic light emitting display device according to Comparative Example 1.

FIG. 1F schematically illustrates an equivalent circuit according to Comparative Example 1. An organic light emitting display device according to Comparative Example 1 is different from the organic light emitting display device 100 according to the example embodiment of the present disclosure in that a first anode line and a first cathode line are disposed on the same side surface in a peripheral area of an organic light emitting display panel. Therefore, a second anode line and a second cathode line are also input of the same direction.

In Comparative Example 1, as the second anode line and the second cathode line are increased in the direction of a Y-axis, the total anode line resistance $RT_{ELVDD}$ and the total cathode line resistance $RT_{ELVSS}$ are also increased at the same time.

For example, the total anode line resistance $(RT_{ELVDD})\Omega$ of a sub-pixel connected with a 1st gate line GATE 1 is $(R_{ELVDD}) \times (\text{GATE } 1)\Omega = (1) \times (R_{ELVDD}) = \Omega$, and the total cathode line resistance $(RT_{ELVSS})\Omega$ is $(R_{ELVSS}) \times (\text{GATE } 1)\Omega = (1) \times (R_{ELVSS})\ \Omega$.

For example, the total anode line resistance $(RT_{ELVDD})\Omega$ of a sub-pixel connected with a 100th gate line GATE 100 is $(R_{ELVDD}) \times (\text{GATE } 100)\Omega = (100) \times (R_{ELVDD})\Omega$, and the total cathode line resistance $(RT_{ELVSS})\Omega$ is $(R_{ELVSS}) \times (\text{GATE } 100)\Omega = (100) \times (R_{ELVSS})\Omega$.

That is, it can be seen that there is a 100 times difference in intensity of line resistance between the sub-pixels connected with the 100th gate line and the 1st gate line.

For example, the total anode line resistance $(RT_{ELVDD})\Omega$ of a sub-pixel connected with a 1080th gate line GATE 1080 is $(R_{ELVDD}) \times (\text{GATE } 1080)\Omega = (1080) \times (R_{ELVDD})\Omega$, and the total cathode line resistance $(RT_{ELVSS})\Omega$ is $(R_{ELVSS}) \times (\text{GATE } 1080)\ \Omega = (1080) \times (R_{ELVSS})\Omega$.

That is, it can be seen that there is a 1080 times difference in intensity of line resistance between the sub-pixels connected with the 1080th gate line and the 1st gate line.

Figure 1G:
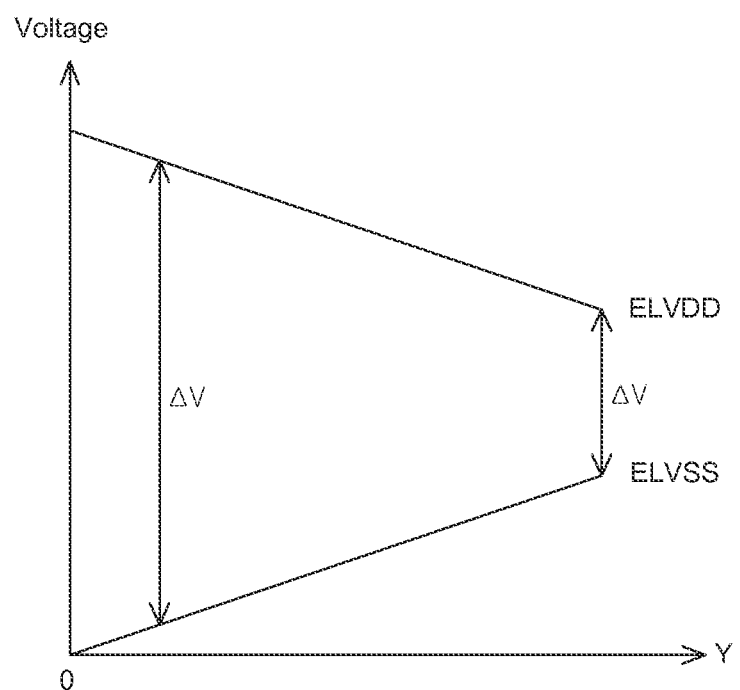
FIG. 1G is a schematic graph provided to describe a potential difference between an anode and a cathode of each sub-pixel in the organic light emitting display device according to Comparative Example 1.

FIG. 1G is a graph provided to describe a potential difference (ΔV) between an anode and a cathode in certain sub-pixels disposed in the direction of a Y-axis among the sub-pixels in the active area of the organic light emitting display device 100 according to Comparative Example 1.

Referring to FIG. 1G, it can be confirmed that a potential difference (ΔV) between an anode and a cathode is gradually decreased as the direction of a Y-axis. Therefore, luminance of the organic light emitting display device is gradually decreased as the direction of a Y-axis. As a result, in Comparative Example 1, the lower side surface (third side surface) looks dark and luminance uniformity is considerably decreased.

Comparative Example 2

Figure 1H:
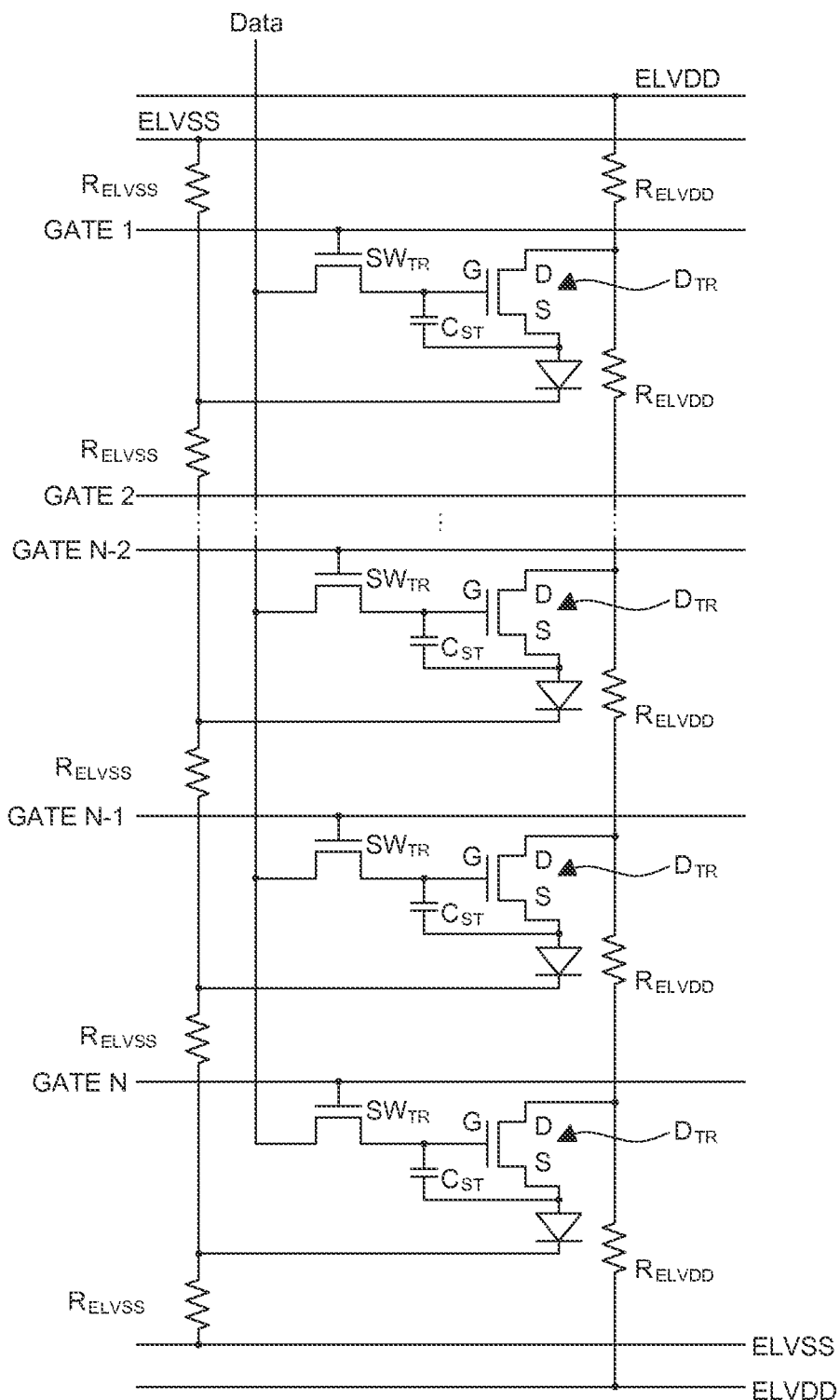
FIG. 1H is a schematic equivalent circuit diagram provided to describe a resistance value of each sub-pixel in an organic light emitting display device according to Comparative Example 2.

FIG. 1H schematically illustrates an equivalent circuit according to Comparative Example 2. An organic light emitting display device according to Comparative Example 2 is different from the organic light emitting display device according to Comparative Example 1 in that a first anode line and a first cathode line are disposed on both side surfaces (a first side surface and a third side surface) in a peripheral area of an organic light emitting display panel. Therefore, a second anode line and a second cathode line are also input of both directions.

In Comparative Example 2, since an anode voltage ELVDD and a cathode voltage ELVSS are applied from the both side surfaces (the first side surface and the third side surface), a potential difference (ΔV) between an anode and a cathode is decreased as proceeding toward a central part of an active area.

Figure 1I:
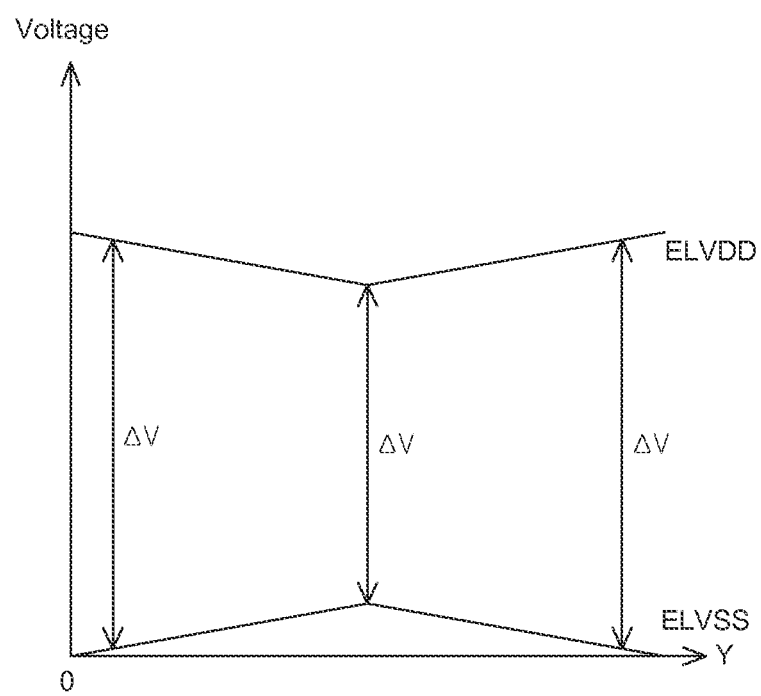
FIG. 1I is a schematic graph provided to describe a potential difference between an anode and a cathode of each sub-pixel in the organic light emitting display device according to Comparative Example 2.

FIG. 1I is a graph provided to describe a potential difference (ΔV) between an anode and a cathode in certain sub-pixels disposed in the direction of a Y-axis among the sub-pixels in the active area of the organic light emitting display device 100 according to Comparative Example 2.

Referring to FIG. 1I, it can be confirmed that a potential difference (ΔV) between an anode and a cathode is gradually decreased toward the central part of the active area. Therefore, the central part of the active area looks dark and luminance uniformity considerably deteriorates.

Figure 2:
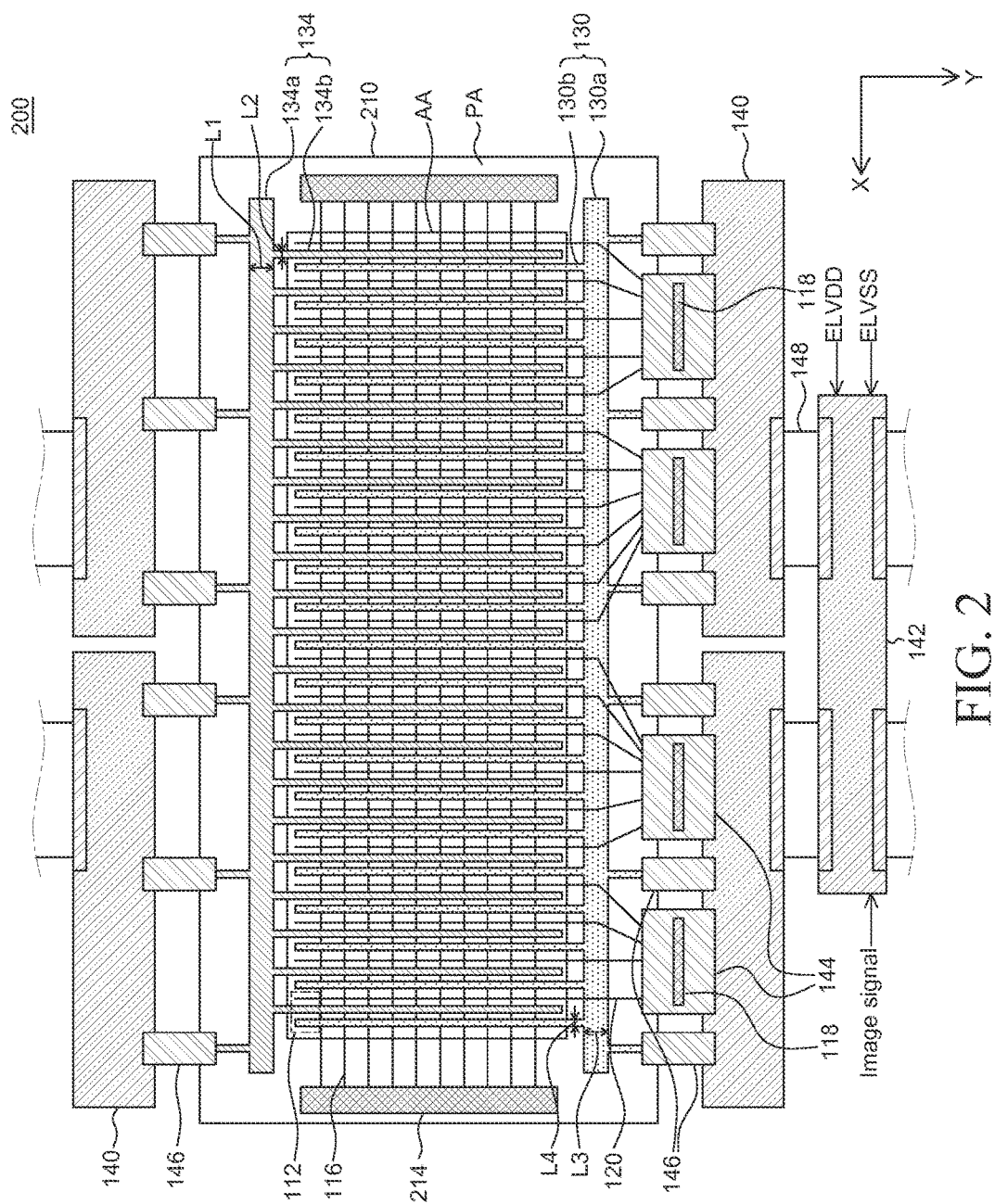
FIG. 2 is a schematic plan view of an organic light emitting display device according to another example embodiment of the present disclosure.

FIG. 2 is a schematic plan view of an organic light emitting display device according to another example embodiment of the present disclosure.

In an organic light emitting display device 200 according to another example embodiment of the present disclosure, a gate driver IC 214 is implemented as a gate-driver in panel (GIP) in order to implement a narrow bezel. The gate driver IC 214 is used to form a plurality of sub-pixels 112 of an organic light emitting display panel 210 and formed in a peripheral area PA of the organic light emitting display panel 210 at the same time.

The gate driver IC 214 includes a plurality of shift registers, and the shift registers are connected with the respective gate lines 116. The gate driver IC 214 receives a gate start pulse (GSP) and a plurality of clock signals from the data driver IC 118, and the shift registers of the gate driver IC 214 shift the gate start pulse (GSP) in sequence and activate the plurality of sub-pixels 112 respectively connected with the gate lines 116.

If the gate-driver in panel 214 is disposed, the semiconductor chip-shaped gate driver IC 114, an anisotropic conductive film, and a corresponding pad may be removed, and it is possible to implement a narrow bezel having a smaller width than a bezel of the semiconductor chip-shaped gate driver IC.

Except for the above-described matters, the organic light emitting display device 200 according to another example embodiment of the present disclosure is the same as the organic light emitting display device 100 according to the example embodiment of the present disclosure. Therefore, redundant description thereof will be omitted.

In some example embodiments, the gate driver IC may be formed only on one side surface (second side surface) of the organic light emitting display panel. If the gate driver IC formed only on one side surface (second side surface) is disposed, it is possible to implement a narrow bezel having a smaller width on the other side surface (fourth side surface) than a bezel on the side surface (second side surface).

In some example embodiments, the gate-driver in panel (GIP) illustrated in FIG. 2 can be applied to all the other example embodiments.

Figure 3:
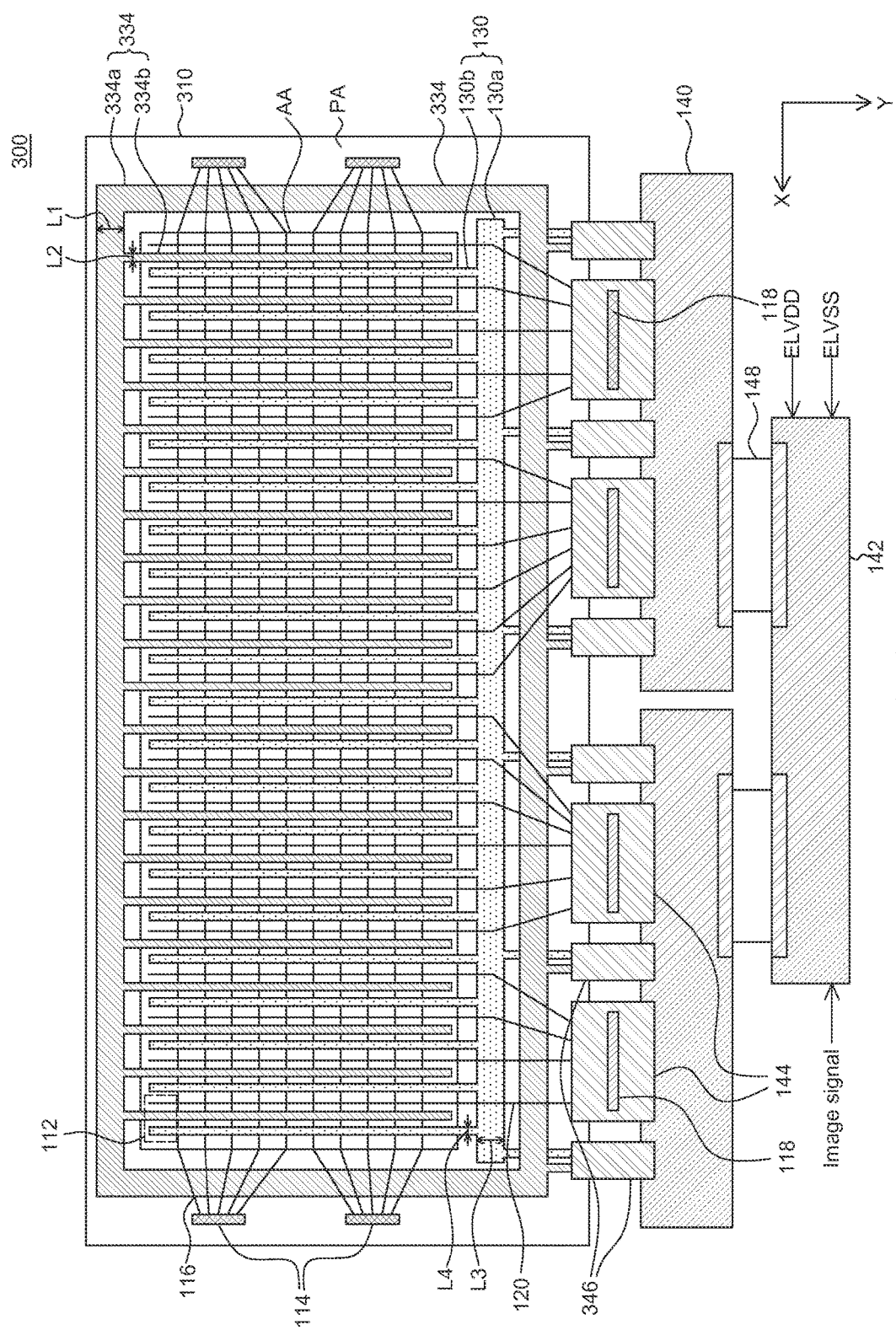
FIG. 3 is a schematic plan view of an organic light emitting display device according to yet another example embodiment of the present disclosure.

FIG. 3 is a schematic plan view of an organic light emitting display device according to yet another example embodiment of the present disclosure.

In an organic light emitting display device 300 according to yet another example embodiment of the present disclosure, the first anode line 130a and a first cathode line 334a of a cathode line 334 are disposed on an upper side surface (first side surface) of an organic light emitting display panel 310. Herein, the first cathode line 334a is disposed to surround a peripheral area PA of the organic light emitting display panel 310. That is, the first cathode line 334a may be disposed along the first side surface, a second side surface, a third side surface, and a fourth side surface of the organic light emitting display panel 310, or may be configured to have a square shape or a ring shape. Herein, a length of the first cathode line 334a is longer than a length of the first anode line 130a, and thus, preferably, a width of the first cathode line 334a is set to be greater than a width of the first anode line 130a so as not to increase a line resistance. Therefore, the width of the first cathode line 334a is configured to be greater than the width of the first anode line 130a. The second anode line 130b and the second cathode line 134b are extended from the first anode line 130a and the first cathode line 134a, respectively.

Since the first anode line 130a and the first cathode line 334a of the organic light emitting display device 300 are disposed on the upper side surface (first side surface) of the organic light emitting display panel 310, a second flexible circuit board 346 is configured to supply an anode voltage ELVDD and a cathode voltage ELVSS at the same time.

According to the above-described configuration, the organic light emitting display device 300 has an effect of removing the data circuit board 142 and the second flexible circuit board 146 disposed on the lower side surface (third side surface) of the organic light emitting display device 100.

According to the above-described configuration, the organic light emitting display device 300 can be a transparent organic light emitting display device. To be specific, in order to input an anode voltage ELVDD and a cathode voltage ELVSS from the opposite directions as illustrated in FIG. 1B, various circuit boards and lines need to be disposed on a rear surface of the organic light emitting display panel 110. However, in the organic light emitting display panel 310 according to yet another example embodiment of the present disclosure, the upper side surface (first side surface) includes circuit boards and lines, and thus, various circuit boards and lines do not need to be disposed on a rear surface of the organic light emitting display panel 310. Therefore, even if the organic light emitting display panel 310 has light transparency, circuit boards and lines can be invisible on the rear surface.

Except the above-described matters, the organic light emitting display device 300 according to yet another example embodiment of the present disclosure is the same as the organic light emitting display device 100 according to the example embodiment of the present disclosure. Therefore, redundant description thereof will be omitted.

In some example embodiments, the first anode line and the first cathode line may be reversed. To be specific, the first anode line may be disposed to surround the peripheral area PA of the organic light emitting display panel and the first cathode line may be disposed along the upper side surface (first side surface) of the organic light emitting display panel.

In some example embodiments, a light transmission part for providing light transparency to sub-pixels 412 of an organic light emitting display panel 410 may be further included.

Figure 4A:
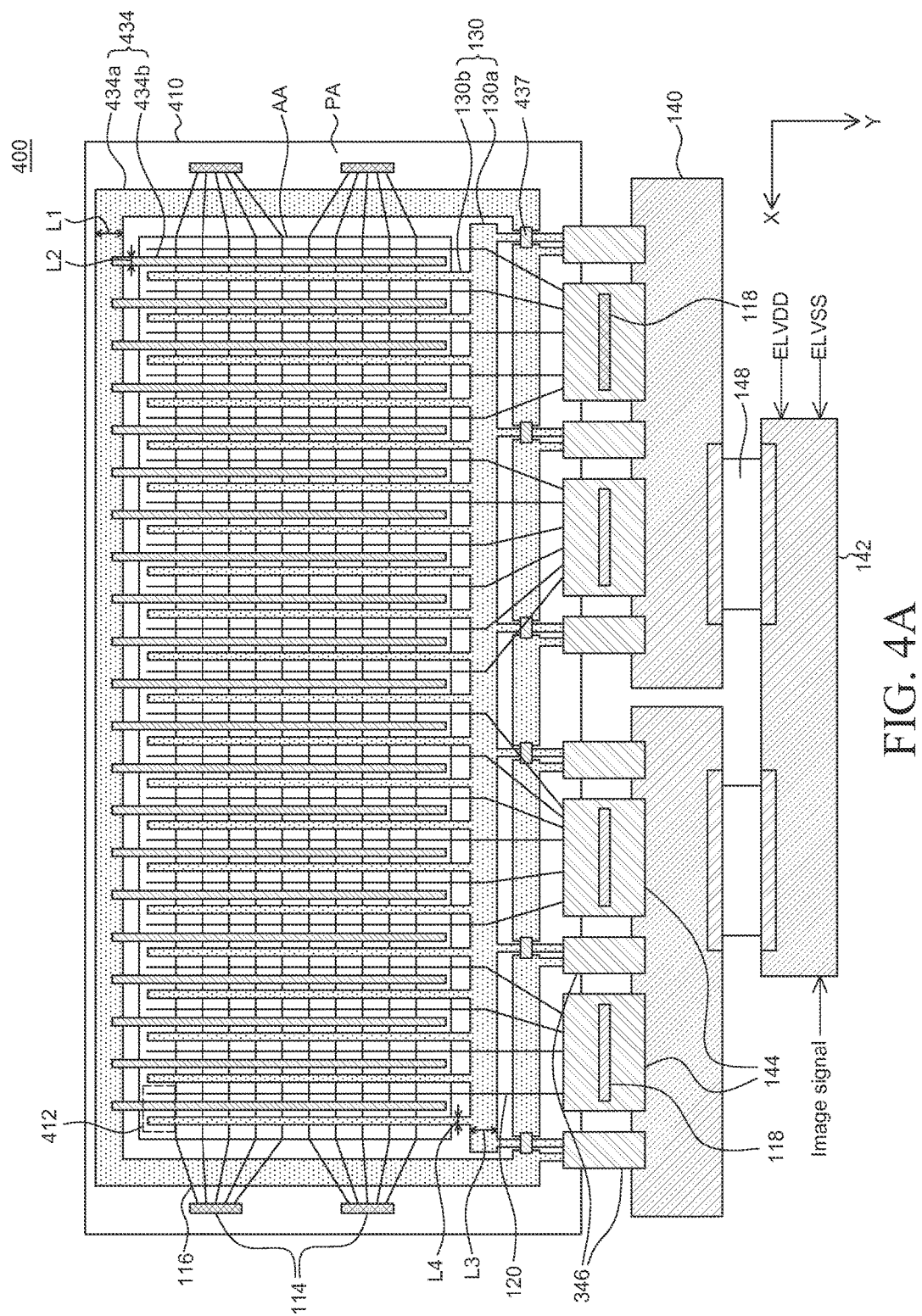
FIG. 4A is a schematic plan view of an organic light emitting display device according to still another example embodiment of the present disclosure.

FIG. 4A is a schematic plan view of an organic light emitting display device according to still another example embodiment of the present disclosure.

An organic light emitting display device 400 according to still another example embodiment of the present disclosure is an example of a modification of the organic light emitting display device 300 according to yet another example embodiment of the present disclosure.

The first anode line 130a and a first cathode line 434a of the organic light emitting display device 400 are formed of the same material. Therefore, the first anode line 130a and the first cathode line 434a cannot be overlapped with each other, where the first cathode line 434a is separated from an area where the first anode line 130a and the first cathode line 434a are overlapped. That is, the first cathode line 434a is divided into at least two parts in a peripheral area PA and the divided parts are connected by a jump line 437.

Figure 4B:
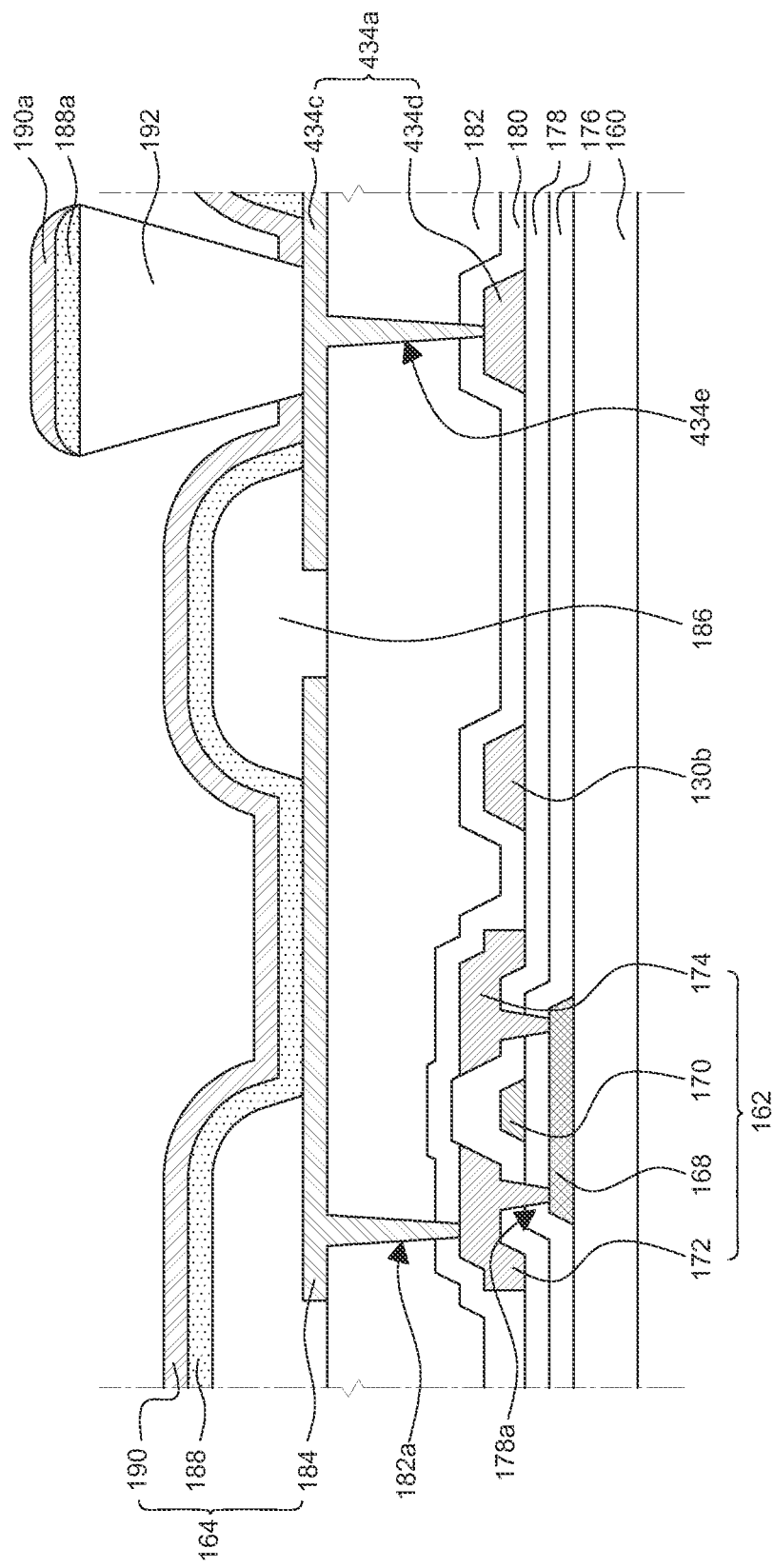
FIG. 4B is a schematic cross-sectional view of a sub-pixel of the organic light emitting display device according to still another example embodiment of the present disclosure illustrated in FIG. 4A.

FIG. 4B is a cross-sectional view of the sub-pixel 412 of the organic light emitting display device 400 according to still another example embodiment of the present disclosure illustrated in FIG. 4A.

A second cathode line 434b of a cathode line 434 includes at least two metal layers, and includes, for example, a second cathode first line 434c and a second cathode second line 434d as illustrated in FIG. 4B.

The second cathode first line 434c is formed of the same material as the anode 184. The second cathode second line 434d is formed of the same material as that of the second anode line 130b. The first cathode first line 434c and the second cathode second line 434d are connected with each other through a third contact hole 434e.

According to the above-described configuration, it is possible to reduce thickness of the first cathode line 434a. To be specific, the first cathode line 434a may be formed of the same material as that of the data line 120. Therefore, the first cathode line 434a can be formed to have a greater thickness, and thus, the width L1 of the first cathode line 434a can be reduced.

According to the above-described configuration, it is possible to reduce a width L4 of the second cathode line 434b. To be specific, a cross-section area can be increased by the second cathode first line 434c and the second cathode second line 434d, and thus, the width of the second cathode line 434b can be reduced.

Except the above-described matters, the organic light emitting display device 400 according to still another example embodiment of the present disclosure is the same as the organic light emitting display device 300 according to still another example embodiment of the present disclosure. Therefore, redundant description thereof will be omitted.

In some example embodiments, the first anode line and the first cathode line may be reversed. To be specific, the first anode line may be disposed to surround the peripheral area PA of the organic light emitting display panel and the first cathode line may be disposed along the upper side surface (first side surface) of the organic light emitting display panel.

Figure 5A:
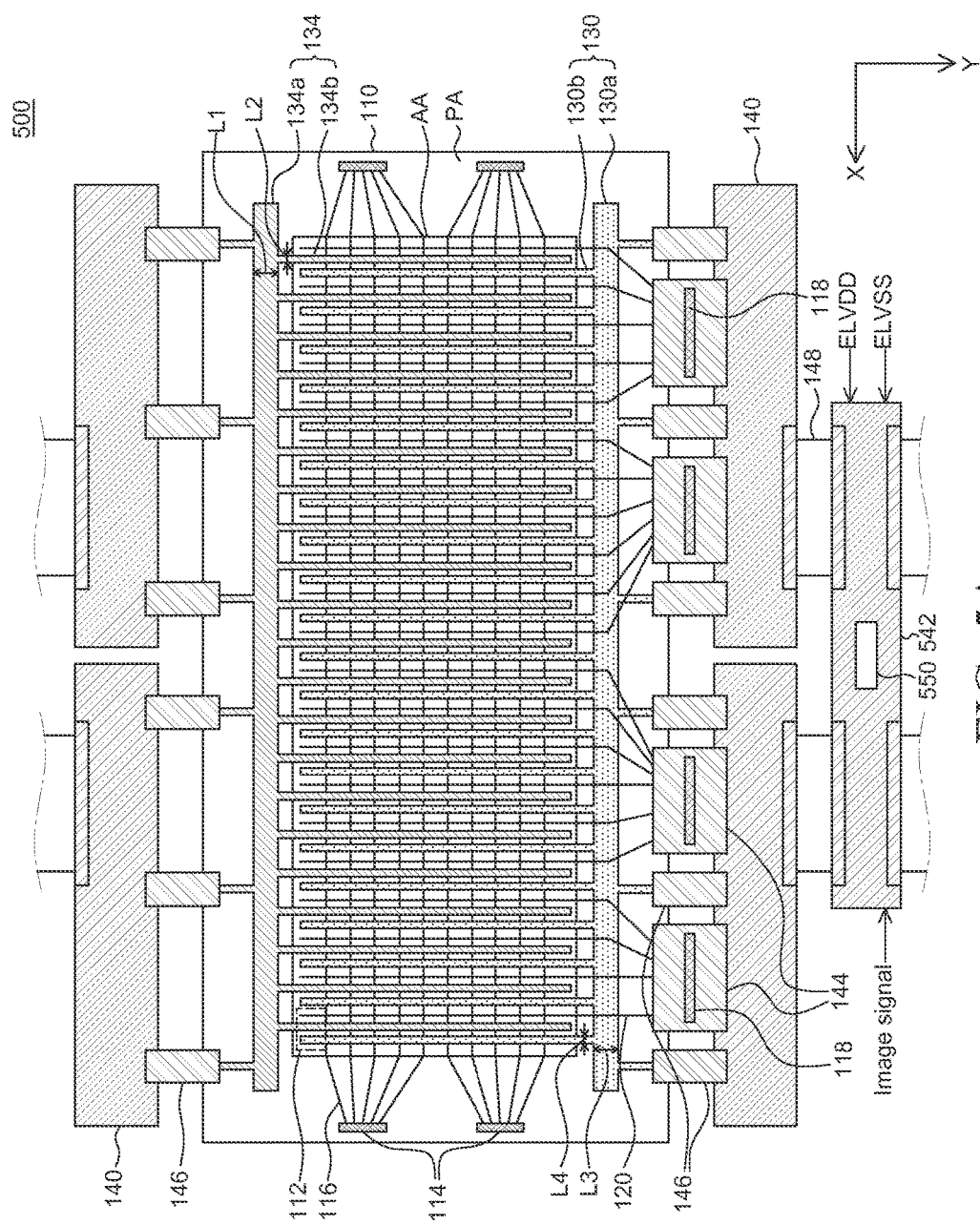
FIG. 5A is a schematic plan view of an organic light emitting display device including an image signal compensation unit according to still another example embodiment of the present disclosure.

FIG. 5A is a schematic plan view of an organic light emitting display device according to still another example embodiment of the present disclosure.

An organic light emitting display device 500 according to still another example embodiment of the present disclosure is a modified example of the organic light emitting display device 100 according to an example embodiment of the present disclosure.

In the organic light emitting display device 500, an image signal compensation unit 550 is disposed on a control circuit board 542.

The image signal compensation unit 550 is configured to store voltage compensation data. The voltage compensation data may be stored in a memory within the image signal compensation unit 550 or in a separate external memory. The voltage compensation data are configured to store compensation values respectively corresponding to the sub-pixels 112. On the basis of line resistance information of the first cathode line 134 within the active area AA, the voltage compensation data include information for compensating each of the cathode voltage increments (ΔELVSS) corresponding to the sub-pixels 112. The voltage compensation data may be determined on the basis of design values of the lines in the organic light emitting display panel 110. For example, the design values of the lines can be calculated on the basis of a width, thickness, length of a line, resistivity ρ of a line, and positional information of each sub-pixel 112 to be compensated. Otherwise, information of the total cathode line resistance ($RT_{ELVSS}$)Ω or the second cathode unit line resistance ($RE_{LVSS}$) already calculated when the panel is designed may be used.

If a cathode voltage ELVSS is modified by a line resistance, a potential difference between the gate electrode G and the source electrode S in the driving transistor $D_{TR}$, i.e., a gate electrode-source electrode potential difference (Vgs), may be modified. Therefore, luminance may be partially modified.

The image signal compensation unit 550 modifies an image signal on the basis of the stored voltage compensation data, and sends a compensated image signal to the data driver IC 118. In example embodiments, the image signal is compensated proportionally to the increment in the cathode voltage ELVSS.

In some example embodiments, the image signal compensation unit 550 may be configured to calculate voltage compensation data while the organic light emitting display device 100 is operated. The image signal compensation unit 550 stores only the design values of the lines in the organic light emitting display panel 110 and the design values are required for calculation of voltage compensation data. Further, the calculation of voltage compensation data is performed while the organic light emitting display device is operated. In particular, according to the above-described configuration, there is an advantage in that voltage compensation data may not be stored. Also, there is an advantage of being easily applicable to organic light emitting display panels of various sizes and shapes.

In some example embodiments, the image signal compensation unit 550 can store only voltage compensation data corresponding to a row of sub-pixels 112 disposed in a vertical direction (Y-axis). In particular, as illustrated in FIG. 1D, since a plurality of rows of sub-pixels 112 has similar line resistance characteristics, by setting voltage compensation data of a row of sub-pixels 112 as reference voltage compensation data, it is possible to compensate other rows of sub-pixels 112.

In some example embodiments, when the image signal compensation unit 550 compensates the plurality of rows of sub-pixels 112 with reference voltage compensation data corresponding to a row of sub-pixels 112, offset values for respectively compensating differences among the sub-pixels 112 in each row may be further included. In particular, a voltage supply pad may be included.

In some example embodiments, the image signal compensation unit 550 can exclude or add some information of the design values of some lines for calculation. According to the above-described configuration, the image signal compensation unit 550 updates only information optimized for an organic light emitting display panel, and thus, has an advantage of being able to increase compensation efficiency.

In some example embodiments, the voltage compensation data in the image signal compensation unit 550 may be configured in the form of a look-up table.

In some example embodiments, the image signal compensation unit 550 may be configured to be included in the data driver IC 118. Otherwise, the image signal compensation unit 550 may be disposed on the data circuit board 140. That is, the image signal compensation unit 550 is not limited to be disposed on the control circuit board 542, but can be disposed or included in other various components.

Figure 5B:
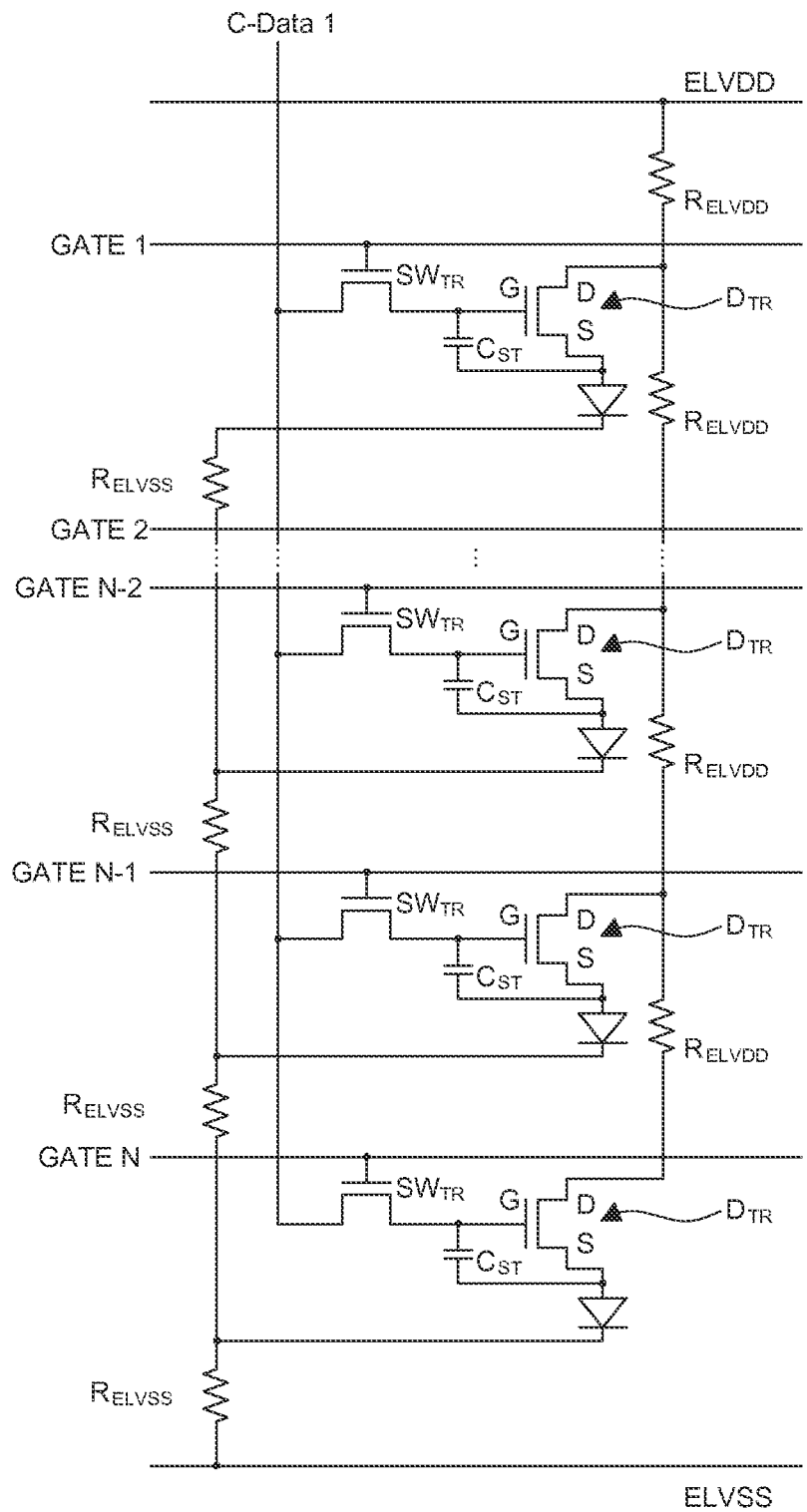
FIG. 5B is a schematic equivalent circuit diagram provided to describe a resistance value of each sub-pixel in an organic light emitting display device to which a compensated image signal is supplied according to still another example embodiment of the present disclosure.

FIG. 5B is a schematic equivalent circuit diagram provided to describe a resistance value of each sub-pixel in an organic light emitting display device to which a compensated image signal is supplied according to still another example embodiment of the present disclosure disclosed in FIG. 5A.

Each sub-pixel 112 includes at least an organic light emitting diode, a driving transistor $D_{TR}$, a switching transistor $SW_{TR}$, a capacitor $C_{ST}$, a gate line GATE, and a data line DATA. Such a structure may be classified as a 2T1C structure including two transistors and one capacitor $C_{ST}$.

A first image signal C-Data1 compensated by the image signal compensation unit 550 is applied to the gate electrode G of the driving transistor $D_{TR}$. Therefore, a potential difference between the gate electrode G and the source electrode S, i.e., a gate electrode-source electrode potential difference (Vgs), may be compensated. Therefore, luminance may be further improved.

Figure 5C:
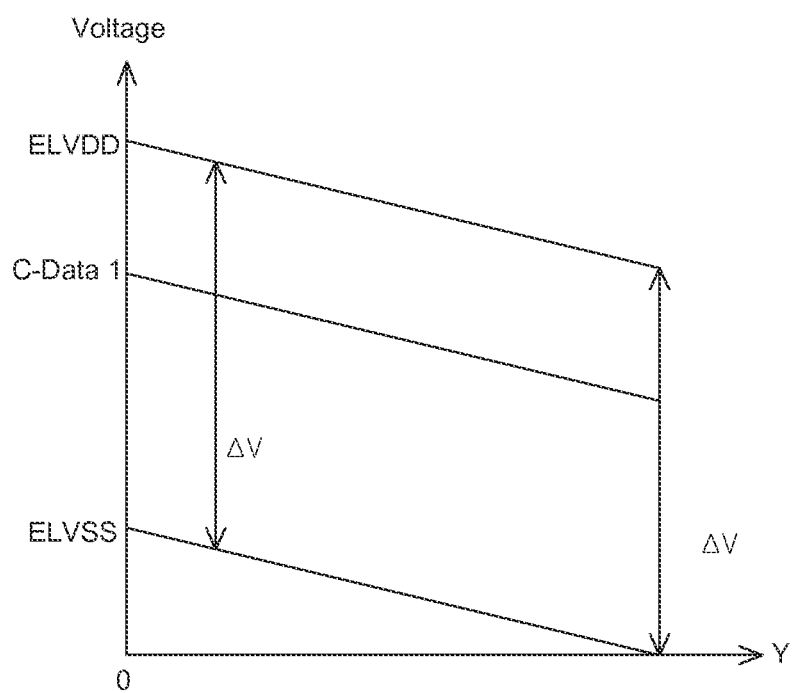
FIG. 5C is a schematic graph provided to describe a potential difference between anode and cathode of each sub-pixel, and a compensated image signal in the organic light emitting display device according to still another example embodiment of the present disclosure.

FIG. 5C is a schematic graph provided to describe a potential difference between anode and cathode of each sub-pixel and a compensated image signal in the organic light emitting display device according to still another example embodiment of the present disclosure.

The compensated first image signal C-Data1 in FIG. 5C is illustrated as compensated data obtained by increasing voltage of an image signal applied to each sub-pixel 112 by a cathode voltage increment (ΔELVSS) corresponding to each sub-pixel 112 having a 2T1C sub-pixel structure. Herein, since all of image signals before compensation display the same luminance, the same voltage needs to be applied thereto. However, since the cathode voltage ELVSS is increased, the compensated first image signal C-Data1 is directly proportional to the increase in the cathode voltage ELVSS.

For example, the compensated first image signal C-Data1 according to the voltage compensation data applied to one of the sub-pixels 112 may be described with reference to Equation 2.

$$(C\text{-Data1}) = \text{Image signal} + \text{Cathode voltage increment} (\Delta ELVSS) \quad \text{[Equation 2]}$$

The C-Data1 is a compensated image signal applied through a data line. The image signal in Equation 2 is an analogue image signal converted from a digital image signal input from an external system into a voltage value by a data driver IC. The cathode voltage increment (ΔELVSS) refers to a voltage value increased by a line resistance.

That is, if a cathode voltage ELVSS of a certain 2T1C sub-pixel 112 is increased by 0.1 V, the image signal compensation unit 550 generates C-Data1 by compensating a voltage value of an image signal applied to the sub-pixel 112 using the voltage compensation data such that the image signal can be increased by 0.1 V.

That is, the voltage compensation data can be realized by adding an increment of a cathode voltage ELVSS corresponding to each sub-pixel 112 to an image signal applied to the sub-pixel 112. The compensated first image signal C-Data1 is applied to the gate electrode G of the driving transistor $D_{TR}$ of the sub-pixel 112. Therefore, luminance uniformity of an organic light emitting display device can be further improved with the voltage compensation data.

Except the above-described matters, the organic light emitting display device 500 according to still another example embodiment of the present disclosure is the same as the organic light emitting display device 100 according to an example embodiment of the present disclosure. Therefore, redundant description thereof will be omitted.

Figure 6A:
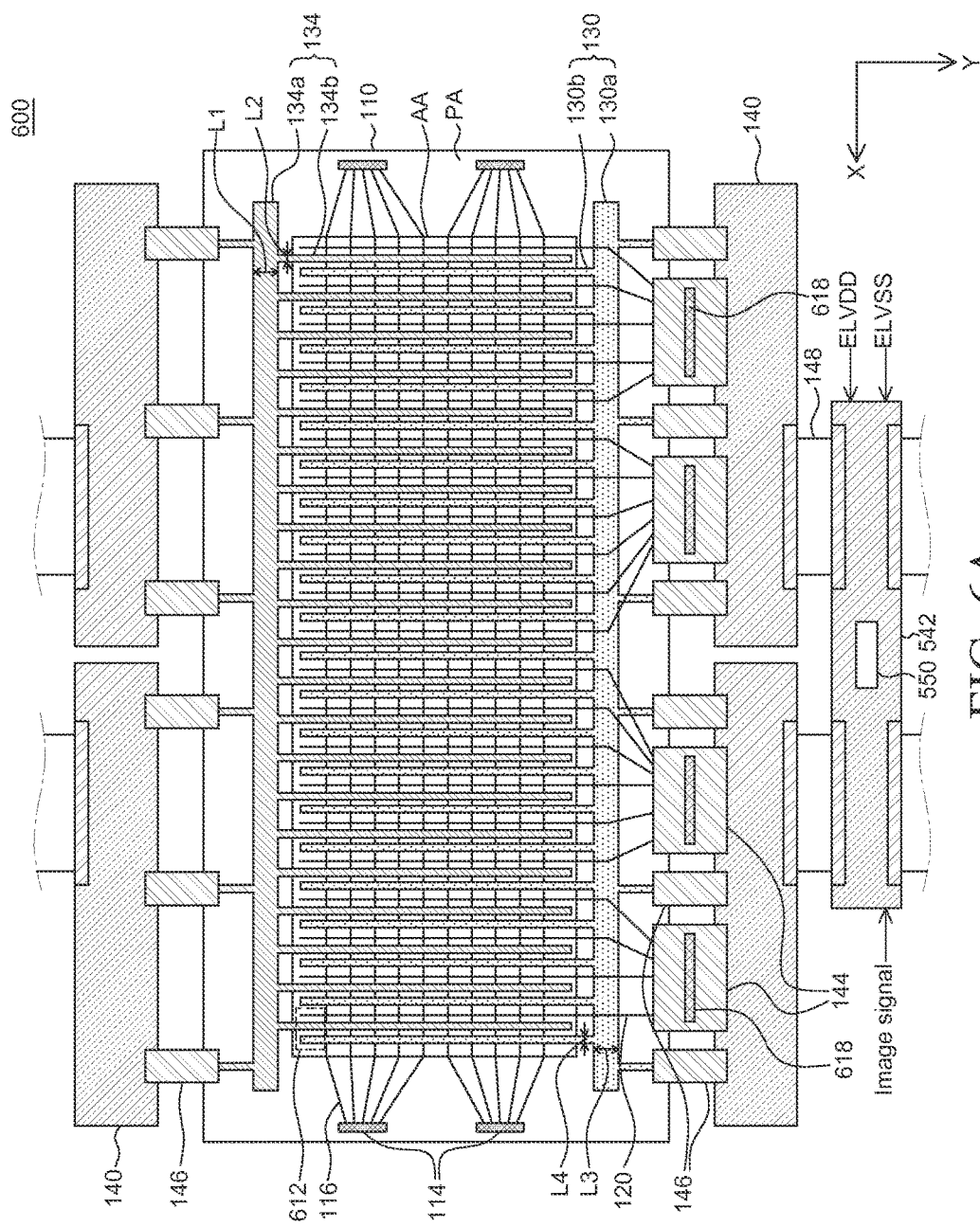
FIG. 6A is a schematic plan view of an organic light emitting display device including a data driver IC according to still another example embodiment of the present disclosure.
Figure 6B:
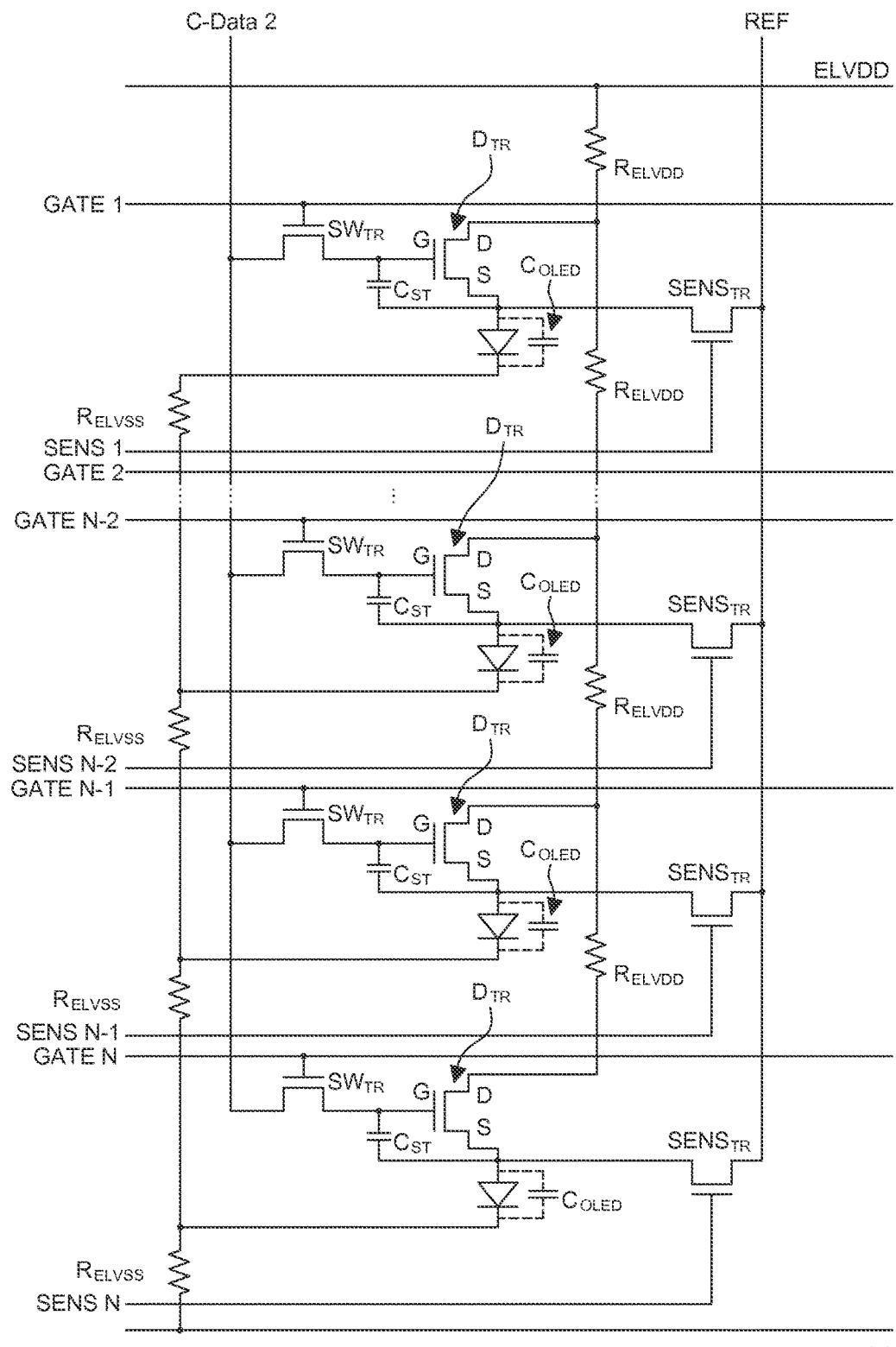
FIG. 6B is a schematic equivalent circuit diagram provided to describe a resistance value of each modified sub-pixel in an organic light emitting display device to which a compensated image signal is supplied according to still another example embodiment of the present disclosure.

FIG. 6A is a schematic plan view of an organic light emitting display device including a data driver IC according to still another example embodiment of the present disclosure. An organic light emitting display device 600 according to still another example embodiment of the present disclosure is a modification example of the organic light emitting display device 100 according to an example embodiment of the present disclosure. FIG. 5B is a schematic equivalent circuit diagram provided to describe a resistance value of each sub-pixel in an organic light emitting display device to which a compensated image signal is supplied according to still another example embodiment of the present disclosure disclosed in FIG. 5A.

Each sub-pixel 612 includes at least an organic light emitting diode, a driving transistor $D_{TR}$, a switching transistor $SW_{TR}$, a sensing transistor $SEN_{TR}$, a capacitor $C_{ST}$, a gate line GATE, a data line DATA, a reference line REF, a sensing line SENS. Such a structure may be classified as a 3T1C structure including three transistors and one capacitor.

A second image signal C-Data2 compensated by the image signal compensation unit 550 is applied to the gate electrode G of the driving transistor $D_{TR}$. Therefore, a potential difference between the gate electrode G and the source electrode S, i.e., a gate electrode-source electrode potential difference (Vgs), may be compensated. Since the potential difference between the gate electrode G and the source electrode S is compensated, luminance uniformity can be further improved.

Further, since the sub-pixel 612 has a 3T1C structure, even if a cathode voltage ELVSS is increased in the same manner as illustrated in FIG. 5B, the voltage compensation data are not directly proportional to a cathode voltage increment (ΔELVSS). To be specific, the voltage compensation data refer to data obtained by reflecting an inherent capacitance $C_{OLED}$ of the organic light emitting diode and a capacitance $C_{st}$ of the capacitor $C_{ST}$ to the cathode voltage increment (ΔELVSS).

For example, the compensated second image signal C-Data2 according to the voltage compensation data applied to one of the sub-pixels 612 may be described with reference to Equation 3.

(C-Data2)=Image signal+Cathode voltage increment
(ΔELVSS)×$C_{OLED}/C_{st}$.    [Equation 3]

The C-Data2 is a compensated image signal applied through a data line. The image signal in Equation 3 is an analogue image signal converted from a digital image signal input from an external system into a voltage value by a data driver IC 618. The cathode voltage increment (ΔELVSS) refers to a voltage value increased by a line resistance. The $C_{OLED}$ represents an inherent capacitance of the organic light emitting diode. The $C_{st}$ represents a capacitance of the capacitor $C_{ST}$.

In addition, in the 3T1C structure, the sensing transistor $SEN_{TR}$ is further disposed in order to compensate a threshold voltage difference (ΔVth) of the driving transistor $D_{TR}$. Further, the sensing transistor $SEN_{TR}$ transfers information of the threshold voltage difference (ΔVth) of each driving transistor $D_{TR}$ to the reference line REF by a signal applied to the sensing line SENS. The reference line REF may be connected with the data driver IC 618. Herein, the data driver IC 618 senses a threshold voltage difference (ΔVth) of the driving transistor $D_{TR}$, and a threshold voltage difference compensation circuit may be configured to compensate the sensed difference.

Figure 6C:
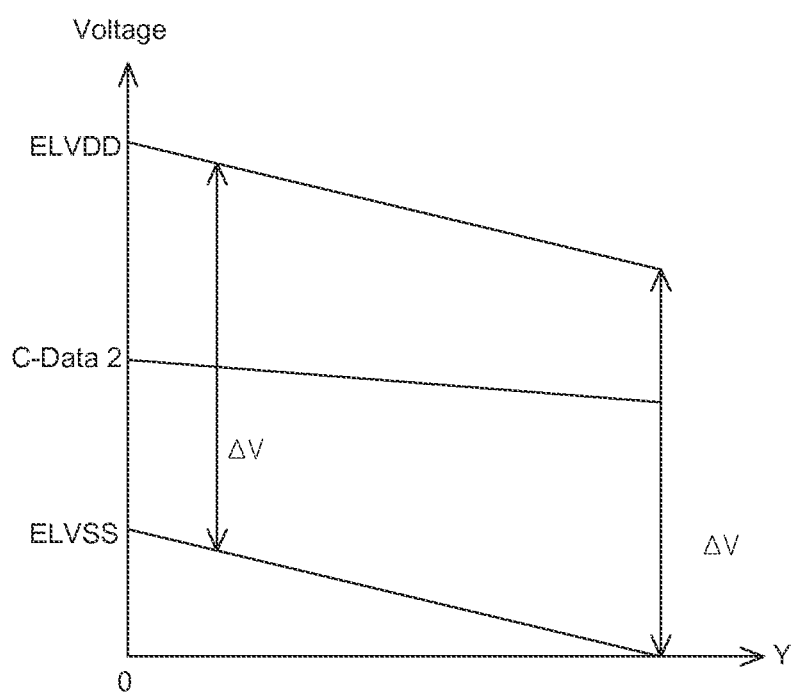
FIG. 6C is a schematic graph provided to describe a potential difference between anode and cathode of each modified sub-pixel, and a compensated image signal in the organic light emitting display device according to still another example embodiment of the present disclosure.

FIG. 6C is a schematic graph provided to describe a potential difference between anode and cathode of each modified sub-pixel and a compensated image signal in the organic light emitting display device according to still another example embodiment of the present disclosure.

The compensated second image signal C-Data2 in FIG. 6C is illustrated as compensated data obtained by increasing a voltage of an image signal. An image signal is then applied to each sub-pixel 612 by a cathode voltage increment (ΔELVSS) corresponding to each sub-pixel 612 having a 3T1C sub-pixel structure. Herein, since all of image signals before compensation display the same luminance, the same voltage needs to be applied thereto. However, since the cathode voltage ELVSS is increased, the compensated second image signal C-Data2 is compensated according to an increase in the cathode voltage ELVSS and a capacitance ratio between the organic light emitting diode and the capacitor.

That is, the image signal compensation unit 550 increases a cathode voltage ELVSS of a certain sub-pixel 112 by 0.1 V, and modifies a voltage value of an image signal applied to the sub-pixel 112. The modification is achieved by using voltage compensation data obtained by reflecting an inherent capacitance $C_{OLED}$ of the organic light emitting diode and a capacitance $C_{st}$ of the capacitor $C_{ST}$ to 0.1 V. Therefore, luminance uniformity can be further improved with the voltage compensation data.

In some example embodiments, the second image signal C-Data2 compensated in the data driver IC 618 may be configured to include all of a compensation value according to the increase in the cathode voltage ELVSS and a compensation value for compensating the threshold voltage difference (ΔVth) of each driving transistor $D_{TR}$.

For example, a compensated image signal C-Data3 according to voltage compensation data applied to one of the sub-pixels 612 may be described with reference to Equation 4.

(C-Data3)=Image signal+Cathode voltage increment
(ΔELVSS)×$C_{OLED}/C_{st}$+(ΔVth)    [Equation 4]

Except the above-described matters, the organic light emitting display device 600 according to still another example embodiment of the present disclosure is the same as the organic light emitting display device 500 according to still another example embodiment of the present disclosure. Therefore, redundant description thereof will be omitted.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:

1. An organic light emitting display device comprising:
an active area including a plurality of sub-pixels including an anode and a cathode;
a peripheral area configured to surround the active area;
an anode line configured to supply an anode voltage to the anode; and
a cathode line configured to supply a cathode voltage to the cathode,
wherein the anode line is electrically connected to the plurality of sub-pixels and extends from an edge of the peripheral area to an opposing edge of the peripheral area,
wherein the cathode line is electrically connected to the plurality of sub-pixels and extends from the opposing edge of the peripheral area to the edge of the peripheral area,
wherein the anode line and the cathode line are disposed in parallel to each other in the active area,
wherein a direction of an anode voltage input of the anode line in the active area is opposite to a direction of a cathode voltage input of the cathode line in the active area whereby a deviation in a potential difference between the anode and the cathode is reduced by the anode line and the cathode line, and
wherein the anode line and the cathode line are formed in a comb shape, and comb teeth segments of the anode line and the cathode line are non-overlapped with each other in the active area.

2. The organic light emitting display device according to claim 1, wherein the anode voltage in the anode line is configured to be gradually decreased along the direction of the anode voltage input in the active area,
the cathode voltage in the cathode line is configured to be gradually increased along the direction of the cathode voltage input in the active area, and
a degree of decrease in the anode voltage in the anode line according to a distance and a degree of increase in the cathode voltage in the cathode line according to a distance are set by a line resistance of the anode line and a line resistance of the cathode line, respectively.

3. The organic light emitting display device according to claim 2, wherein the line resistance of the anode line in the active area is adjusted by a width of the anode line in the active area and the line resistance of the cathode line in the active area is adjusted by a width of the cathode line in the active area whereby the deviation in the potential difference between the anode and the cathode in the plurality of sub-pixels is compensated by offsetting the increased cathode voltage in the cathode line based on the width of the cathode line by the decreased anode voltage in the anode line based on the width of the anode line.

4. The organic light emitting display device according to claim 3, wherein the line resistance of the anode line and the line resistance of the cathode line have a difference of less than 10%.

5. An organic light emitting display device comprising:
an active area including a plurality of sub-pixels;
a peripheral area configured to surround the active area;
an anode line including a first anode line disposed along a first edge of the peripheral area and a plurality of second anode lines extended towards a second edge opposing the first edge through the active area so as to supply an anode voltage from the first edge of the peripheral area towards the second edge to the active area, wherein a width of the first anode line is wider than a width of one of the plurality of the second anode lines; and
a cathode line including a first cathode line disposed along the second edge of the peripheral area and a plurality of second cathode lines extended towards the first edge through the active area so as to supply a cathode voltage from the second edge of the peripheral area towards the first edge to the active area, wherein a width of the first cathode line is wider than a width of one of the plurality of the second cathode lines,
wherein the anode line and the cathode line are formed as a comb shape, respectively, and the anode line and the cathode line are non-overlapped with each other.

6. The organic light emitting display device according to claim 5, wherein each of the plurality of sub-pixels includes:
a driving transistor including an active layer, a gate electrode, a source electrode, and a drain electrode;
a data line configured to apply an image signal to the driving transistor; and
an organic light emitting diode driven by the driving transistor and including an anode, an organic light emitting layer, and a cathode,
wherein the data line is electrically connected with the gate electrode of the driving transistor,
the anode line is electrically connected with the drain electrode of the driving transistor, and
the cathode line is electrically connected with the cathode of the organic light emitting diode.

7. The organic light emitting display device according to claim 6, further comprising an image compensation unit configured to compensate a voltage level of an image signal applied to each of the plurality of sub-pixel according to an increment in the cathode voltage in the cathode of each of the plurality of sub-pixels,
wherein the compensated image signal is configured to be applied to the driving transistor through the data line.

8. The organic light emitting display device according to claim 7, wherein the image compensation unit is configured to adjust the image signal in proportion to the increment in the cathode voltage.

9. The organic light emitting display device according to claim 5, further comprising:
at least one circuit board,
wherein the at least one circuit board is disposed so as not to be overlapped with a rear surface of the active area.

10. The organic light emitting display device according to claim 5, wherein one of the anode line and the cathode line is configured to surround the peripheral area, and
the anode line and the cathode line are configured to receive voltages from the same edge of the peripheral area.

11. The organic light emitting display device according to claim 5, further comprising:
a jump line,
wherein the anode line and the cathode line are formed of the same material, one of the anode line and the cathode line is divided into at least two parts in the peripheral area and connected by the jump line.

12. The organic light emitting display device according to claim 5, wherein the cathode line includes at least two metal layers, and the at least the two metal layers are connected with each other through a contact hole.

13. The organic light emitting display device according to claim 5, wherein the plurality of sub-pixels include an anode and a cathode, and wherein in each of the plurality of sub-pixels, the cathode line and the anode line are arranged as an interdigitating shape whereby a deviation in a potential difference between the anode and the cathode is reduced.

14. A display apparatus comprising:

an active area configured to display an image, the active area including a plurality of sub-pixels including an anode and a cathode;

a peripheral area surrounding the active area;

an anode line electrically connected to the anode, the anode line comprising:
   a first portion disposed in the peripheral area and extended along a first edge; and
   a plurality of second portions disposed in the active area, extended from the first portion towards a second edge opposite to the first edge of the peripheral area, extended through the active area and electrically disconnected to each other near the second edge of the peripheral area; and a cathode line electrically connected to the cathode, the cathode line comprising:
   a third portion disposed in the peripheral area and extended along the second edge; and
   a plurality of fourth portions disposed in the active area, extended from the third portion towards the first edge of the peripheral area, extended through the active area and electrically disconnected to each other near the first edge of the peripheral area, Wherein the anode line and the cathode line are formed as a comb shape, respectively, and the anode line and the cathode line are non-overlapped with each other.

15. The display apparatus of claim 14, wherein the first portion has a first width, each of the plurality of second portions has a second width narrower than the first width, the third portion has a third width, and each of the plurality of fourth portions has a fourth width narrower than the third width.

16. The display apparatus of claim 14, wherein the plurality of the second portions and the plurality of fourth portions are disposed in an alternating manner.

* * * * *